US012757549B2

(12) United States Patent
Choi et al.

(10) Patent No.: US 12,757,549 B2
(45) Date of Patent: Oct. 6, 2026

(54) DISPLAY DEVICE, TILED DISPLAY DEVICE, AND MANUFACTURING METHOD FOR DISPLAY DEVICE

(71) Applicant: Samsung Display Co., LTD., Yongin-si (KR)

(72) Inventors: Se Hun Choi, Yongin-si (KR); Dong Sung Lee, Yongin-si (KR); Byung Hoon Kim, Yongin-si (KR); Tae Oh Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 291 days.

(21) Appl. No.: 18/449,052

(22) Filed: Aug. 14, 2023

(65) Prior Publication Data

US 2024/0113270 A1 Apr. 4, 2024

(30) Foreign Application Priority Data

Sep. 29, 2022 (KR) ........................ 10-2022-0124483

(51) Int. Cl.
*H10H 20/857* (2025.01)
*H10W 90/00* (2026.01)
*H10H 20/01* (2025.01)

(52) U.S. Cl.
CPC .......... *H10H 20/857* (2025.01); *H10W 90/00* (2026.01); *H10H 20/0364* (2025.01)

(58) Field of Classification Search
CPC ............. H10H 20/857; H10H 20/0364; H10H 29/142; H01L 25/0753; H01L 25/167; H10D 86/411; H10D 86/441
See application file for complete search history.

(56) References Cited

U.S. PATENT DOCUMENTS 9,854,668 B2 12/2017 Sano et al.
11,335,866 B2 5/2022 Wang et al.
(Continued)

FOREIGN PATENT DOCUMENTS

JP 2017-161887 9/2017
KR 10-2019-0107241 A 9/2019
(Continued)

OTHER PUBLICATIONS

R. Indhu et al., “Overview of Laser Absorptivity Measurement Techniques for Material Processing”, Springer Science +Business Media, LLC, part of Springer Nature 2018, Lasers in Manufacturing and Materials Processing, Oct. 22, 2018 (Total 24 pages).

*Primary Examiner* — Victor A Mandala
(74) *Attorney, Agent, or Firm* — Womble Bond Dickinson (US) LLP

(57) ABSTRACT

A display device includes a base layer including a first base layer and a second base layer disposed on a rear surface of the first base layer, light emitting elements disposed on a surface of the first base layer, and pads including a first pad and a second pad, which are disposed on the rear surface of the first base layer and are spaced apart from each other. The base layer further includes blocking layers which are disposed between the first base layer and the second base layer and at least portions of the blocking layers do not overlap the pads in a plan view. The blocking layers include a first blocking layer and a second blocking layer, which are disposed in different layers.

16 Claims, 19 Drawing Sheets

(56) References Cited

U.S. PATENT DOCUMENTS

| | | | | |
|---|---|---|---|---|
| 11,895,880 | B2 | 2/2024 | Jeon et al. | |
| 12,532,590 | B2 | 1/2026 | Kang et al. | |
| 2011/0204399 | A1* | 8/2011 | Lim | H10H 20/857 257/E33.068 |
| 2017/0150622 | A1* | 5/2017 | Kim | H04M 1/0266 |
| 2017/0288088 | A1* | 10/2017 | Won Cheol | H10H 20/811 |
| 2018/0174973 | A1* | 6/2018 | Aoyagi | H10W 70/65 |
| 2021/0202907 | A1* | 7/2021 | Lee | H10W 90/00 |
| 2021/0217353 | A1* | 7/2021 | Zhao | G09G 3/32 |
| 2022/0077197 | A1* | 3/2022 | Kim | H10D 86/60 |
| 2022/0293636 | A1* | 9/2022 | Lee | H10D 86/60 |
| 2022/0293670 | A1* | 9/2022 | Lee | H10H 20/857 |
| 2022/0352444 | A1* | 11/2022 | Cho | H10H 20/857 |
| 2023/0005961 | A1* | 1/2023 | Jang | H10D 86/451 |
| 2023/0131918 | A1* | 4/2023 | Tonkikh | H10H 20/824 257/13 |
| 2023/0187582 | A1* | 6/2023 | Noh | H10H 20/8312 257/79 |
| 2023/0238493 | A1* | 7/2023 | Lee | G09F 9/3026 257/79 |
| 2023/0387052 | A1* | 11/2023 | Kim | G09G 3/20 |
| 2023/0411580 | A1* | 12/2023 | Song | H10H 20/857 |

FOREIGN PATENT DOCUMENTS

| | | | |
|---|---|---|---|
| KR | 10-2022-0030340 | A | 3/2022 |
| KR | 10-2022-0077223 | A | 6/2022 |

* cited by examiner

PXL(SPXL): SPXL1, SPXL2, SPXL3

DISPLAY DEVICE, TILED DISPLAY DEVICE, AND MANUFACTURING METHOD FOR DISPLAY DEVICE

CROSS-REFERENCE TO RELATED APPLICATION(S)

This application claims priority to and benefits of Korean patent application No. 10-2022-0124483 under 35 U.S.C. § 119(a), filed on Sep. 29, 2022, in the Korean Intellectual Property Office (KIPO), the entire contents of which are incorporated herein by reference.

BACKGROUND

1. Technical Field

The disclosure generally relates to a display device, a tiled display device, and a manufacturing method for a display device.

2. Description of the Related Art

Recently, as interest in information displays is increased, research and development of display devices have been continuously conducted.

SUMMARY

The disclosure provides a display device, a tiled display device, and a manufacturing method for a display device, which can improve process efficiency of the display device.

The disclosure also provides a display device, a tiled display device, and a manufacturing method for a display device, which can prevent a short-circuit defect in the display device.

In accordance with an aspect of the disclosure, a display device may include a base layer including a first base layer and a second base layer disposed on a rear surface of the first base layer, light emitting elements disposed on a surface of the first base layer, and pads including a first pad and a second pad, which are disposed on the rear surface of the first base layer and are spaced apart from each other. The base layer may further include blocking layers which are disposed between the first base layer and the second base layer. At least portions of the blocking layers do not overlap the pads in a plan view. The blocking layers may include a first blocking layer and a second blocking layer, which are disposed in different layers.

In accordance with an embodiment, the second blocking layer may be disposed between adjacent ones of the pads.

In accordance with an embodiment, in a plan view, the first blocking layer and the second blocking layer may overlap each other in an overlapping area, and the first blocking layer and the second blocking layer may not overlap each other in a non-overlapping area.

In accordance with an embodiment, the first blocking layer may include a non-overlapping blocking layer disposed in the non-overlapping area, and an overlapping blocking layer disposed in the overlapping area. The overlapping blocking layer and the non-overlapping blocking layer may include different materials.

In accordance with an embodiment, the second blocking layer may include a polycrystalline silicon, and the overlapping blocking layer may include an amorphous silicon.

In accordance with an embodiment, a thickness of each of the first blocking layer and the second blocking layer in a thickness direction of the base layer may be in a range of about 500 Å to about 800 Å.

In accordance with an embodiment, a thickness of the second blocking layer in a thickness direction of the base layer may be greater than a thickness of the first blocking layer in the thickness direction.

In accordance with an embodiment, the base layer may further include a first barrier layer disposed between the first base layer and the pads, a second barrier layer disposed between the first barrier layer and the first blocking layer, and a third barrier layer disposed between the second barrier layer and the second blocking layer.

In accordance with an embodiment, the first base layer may include polyimide, and the second base layer may include polyimide. The first barrier layer may include a layer including silicon nitride and a layer including silicon oxynitride alternately disposed, the second barrier layer may include a layer including an amorphous silicon and a layer including silicon oxide alternately disposed, and the third barrier layer may include a layer including an amorphous silicon and a layer including silicon oxide alternately disposed.

In accordance with an embodiment, the second blocking layer may include a metal.

In accordance with an embodiment, the third barrier layer may be selectively patterned in an area in which the second blocking layer is disposed.

In accordance with an embodiment, the second blocking layer may include a plurality of patterns spaced apart from each other between the adjacent ones of the pads.

In accordance with an embodiment, in a plan view, the second base layer may not overlap the pads, and the second base layer may include an opening area.

In accordance with an embodiment, the display device may further include a display area in which a pixel including the light emitting elements is disposed, a non-display area surrounding at least a portion of the display area, a driving chip that provides an electrical signal to the pixel, and a chip-on-film on which the driving chip is provided. The pads may be electrically connected to the chip-on-film. The chip-on-film and the driving chip may overlap the display area in a plan view.

In accordance with an embodiment, the display device may further include an anisotropic conductive film including conductive balls, the anisotropic conductive film electrically connecting the chip-on-film and the pads to each other. A distance between the second blocking layer and the pads may be greater than a diameter of the conductive balls.

In accordance with an aspect of the disclosure, a tiled display device may include a plurality of display devices. Each of the plurality of display devices may include a base layer including a first base layer and a second base layer disposed on a rear surface of the first base layer, light emitting elements disposed on a surface of the first base layer, and pads including a first pad and a second pad, which are disposed on the rear surface of the first base layer and are spaced apart from each other. The base layer may further include blocking layers which are disposed between the first base layer and the second base layer and have at least portions not overlapping the pads in a plan view. The blocking layers may include a first blocking layer and a second blocking layer, which are disposed in different layers.

In accordance with an aspect of the disclosure, a method for manufacturing a display device may include forming a pre-etched base layer, and removing at least a portion of the pre-etched base layer. The forming of the pre-etched base layer may include providing a pre-etched second base layer, patterning a first blocking layer and a second blocking layer on the pre-etched second base layer, patterning pads on the pre-etched second base layer, and disposing a first base layer on the pads. The removing of the at least a portion of the pre-etched base layer may include exposing the pads by performing a laser process. The first blocking layer and the second blocking layer may be disposed in different layers.

In accordance with an embodiment, the removing of the at least a portion of the pre-etched base layer may further include forming a second base layer including an opening area by removing at least a portion of the pre-etched second base layer. A laser used for the laser process may be a beam having a UV wavelength band.

In accordance with an embodiment, the method may further include disposing a chip-on-film to be electrically connected to the pads on a rear surface of the second base layer.

In accordance with an embodiment, the first blocking layer may include an overlapping blocking layer overlapping the second blocking layer in a plan view, and a non-overlapping blocking layer not overlapping the second blocking layer in a plan view. Before the removing of the at least a portion of the pre-etched base layer is performed, each of the first blocking layer and the second blocking layer may include an amorphous silicon. After the removing of the at least a portion of the pre-etched base layer is performed, the second blocking layer may include a polycrystalline silicon, the overlapping blocking layer may include an amorphous silicon, and the non-overlapping blocking layer may include a polycrystalline silicon.

BRIEF DESCRIPTION OF THE DRAWINGS

Embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION OF THE EMBODIMENTS

Figure 1:
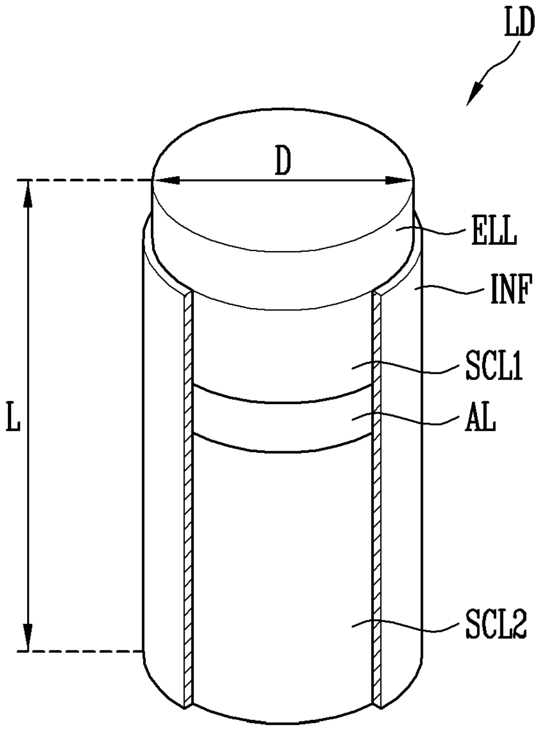
FIG. 1 is a schematic perspective view illustrating a light emitting element in accordance with an embodiment of the disclosure.

The disclosure may apply various changes and different shape, therefore only illustrate in details with particular examples. However, the examples do not limit to certain shapes but apply to all the change and equivalent material and replacement. The drawings included are illustrated a fashion where the figures are expanded for the better understanding.

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof. When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

The disclosure generally relates to a display device, a tiled display device, and a manufacturing method for a display device. Hereinafter, a display device, a tiled display device, and a manufacturing method for a display device in accordance with an embodiment of the disclosure will be described with reference to the accompanying drawings.

Figure 2:
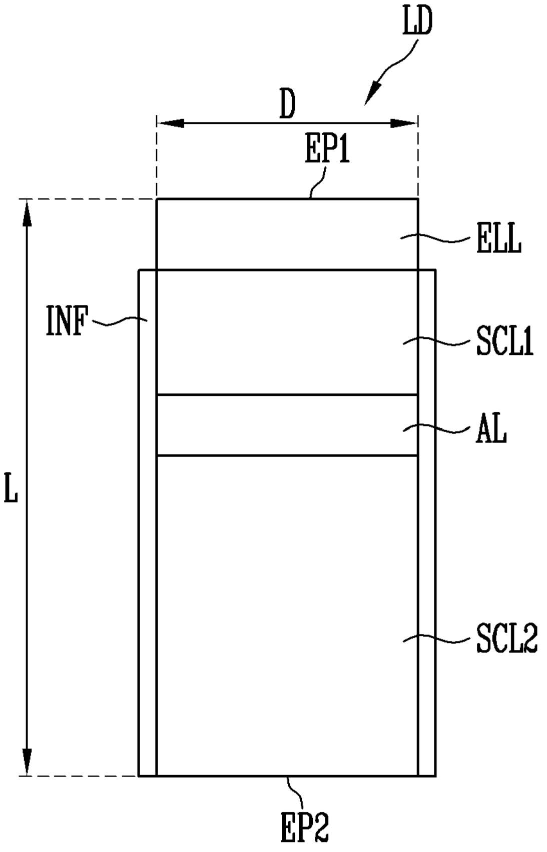
FIG. 2 is a schematic cross-sectional view illustrating the light emitting element in accordance with an embodiment of the disclosure.

First, a light emitting element LD in accordance with an embodiment of the disclosure will be described with reference to FIGS. 1 and 2. FIG. 1 is a schematic perspective view illustrating a light emitting element in accordance with an embodiment of the disclosure. FIG. 2 is a schematic cross-sectional view illustrating the light emitting element shown in FIG. 1.

The light emitting element LD may emit light. The light emitting element LD may include a first semiconductor layer SCL1, a second semiconductor layer SCL2, and an active layer AL disposed between the first semiconductor layer SCL1 and the second semiconductor layer SCL2. In some embodiments, the first semiconductor layer SCL1, the active layer AL, and the second semiconductor layer SCL2 may be sequentially stacked in a length L direction of the light emitting element LD. In some embodiments, the light emitting element LD may further include an electrode layer ELL and an insulative film INF.

The light emitting element LD may have various shapes. For example, the light emitting element LD may have a pillar shape extending in a direction. The pillar shape may include a rod-like shape or bar-like shape, which is long in the length L direction (i.e., its aspect ratio is greater than 1), such as a cylinder or a polyprism, and a cross-sectional shape is not particularly limited. However, the disclosure is not limited to the above-described example.

The light emitting element LD may have a first end portion EP1 and a second end portion EP2. In some embodiments, the first semiconductor layer SCL1 may be disposed adjacent to the first end portion EP1 of the light emitting element LD, and the second semiconductor layer SCL2 may be disposed adjacent to the second end portion EP2 of the light emitting element LD. The electrode layer ELL may be disposed adjacent to the first end portion EP1.

The light emitting element LD may be manufactured by etching sequentially stacked semiconductor layers. The light emitting element LD may have a size of nanometer scale to micrometer scale. For example, the light emitting element LD may have a diameter D (or width) in a range of nanometer scale to micrometer scale and/or a length L in a range of nanometer scale to micrometer scale. However, the size of the light emitting element LD is not limited thereto.

The first semiconductor layer SCL1 may include a first conductivity type semiconductor. The first semiconductor layer SCL1 may be disposed on the active layer AL, and include a semiconductor layer having a type different from a type of the second semiconductor layer SCL2. For example, the first semiconductor layer SCL1 may include a P-type semiconductor layer. For example, the first semiconductor layer SCL1 may include at least one semiconductor material selected from the group consisting of InAlGaN, GaN, AlGaN, InGaN, AlN, and InN, and include a P-type semiconductor layer doped with a first conductivity type dopant such as Ga, B, or Mg. However, the disclosure is not limited to the above-described example. The first semiconductor layer SCL1 may include various materials.

The active layer AL may be disposed between the first semiconductor layer SCL1 and the second semiconductor layer SCL2. The active layer AL may include a single-quantum well structure or a multi-quantum well structure. The position of the active layer AL is not limited, and may be variously changed according to the kind of the light emitting element LD.

A clad layer (not illustrated) doped with a conductive dopant may be formed on and/or below the active layer AL. For example, the clad layer may include at least one of AlGaN and InAlGaN. However, the disclosure is not necessarily limited to the above-described example.

The second semiconductor layer SCL2 may include a second conductivity type semiconductor. The second semiconductor layer SCL2 may be disposed on the active layer AL, and include a semiconductor layer having a type different from the type of the first semiconductor layer SCL1. For example, the second semiconductor layer SCL2 may include an N-type semiconductor layer. For example, the second semiconductor layer SCL2 may include at least one semiconductor material selected from the group consisting of InAlGaN, GaN, AlGaN, InGaN, AlN, and InN, and include an N-type semiconductor layer doped with a second conductivity type dopant such as Si, Ge, or Sn. However, the disclosure is not limited to the above-described example. The second semiconductor layer SCL2 may include various materials.

In case that a voltage which is a threshold voltage or higher is applied to the first end portion EP1 and the second end portion EP2 of the light emitting element LD, electron-hole pairs may be combined in the active layer AL, and the light emitting element LD may emit light. The light emission of the light emitting element LD may be controlled by the principle, so that the light emitting element LD may be used as a light source for various devices.

The insulative film INF may be disposed on a surface of the light emitting element LD. The insulative film INF may surround an outer surface of the active layer AL. The insulative film INF may further surround a portion of each of the first semiconductor layer SCL1 and the second semiconductor layer SCL2. The insulative film INF may have a single-layer or a multi-layer structure.

The insulative film INF may expose the first end portion EP1 and the second end portion EP2 of the light emitting element LD, which have different polarities. For example, the insulative film INF may expose an end of each of the electrode layer ELL and the second semiconductor layer SCL2, which are respectively disposed adjacent to the first end portion EP1 and the second end portion EP2 of the light emitting element LD.

The insulative film INF may include at least one selected from the group consisting of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example.

In accordance with an embodiment, the insulative film INF may ensure the electrical stability of the light emitting element LD. Also, the insulative film INF may minimize a surface defect of the light emitting element LD, thereby improving the lifetime and efficiency of the light emitting element LD. In case that multiple light emitting elements LD are densely disposed, the insulative film INF may prevent a source circuit defect between the light emitting elements LD.

The electrode layer ELL may be disposed on the first semiconductor layer SCL1. The electrode layer ELL may be disposed adjacent to the first end portion EP1. The electrode layer ELL may be electrically connected to the first semiconductor layer SCL1.

A portion of the electrode layer ELL may be exposed. For example, the insulative film INF may expose a surface of the electrode layer ELL. The electrode layer ELL may be exposed in an area corresponding to the first end portion EP1.

In some embodiments, a side surface of the electrode layer ELL may be exposed. For example, the insulative film INF may not cover at least a portion of the side surface of the electrode layer ELL while covering a side surface of each of the first semiconductor layer SCL1, the active layer AL, and the second semiconductor layer SCL2. Thus, the electrode layer ELL disposed adjacent to the first end portion EP1 may be readily connected to another component. In some embodiments, the insulating layer INF may expose not only the side surface of the electrode layer ELL but also a portion of a side surface of the first semiconductor layer SCL1 and/or the second semiconductor layer SCL2.

In accordance with an embodiment, the electrode layer ELL may be an ohmic contact electrode. However, the disclosure is not necessarily limited to the above-described example. For example, the electrode layer ELL may be a Schottky contact electrode.

In accordance with an embodiment, the electrode layer ELL may include at least one selected from the group consisting of chromium (Cr), titanium (Ti), aluminum (Al), gold (Au), nickel (Ni), and any oxide or alloy thereof. However, the disclosure is not necessarily limited to the above-described example. In some embodiments, the electrode layer ELL may be substantially transparent. For example, the electrode layer ELL may include indium tin oxide (ITO). Accordingly, the electrode layer EEL may transmit light therethrough.

The structure, shape, and the like of the light emitting element LD are not limited to the above-described example. In some embodiments, the light emitting element LD may have various structures and various shapes. For example, the light emitting element LD may include an additional electrode layer which is disposed on a surface of the second semiconductor layer SCL2 adjacent to the second end portion EP2.

Figure 3:
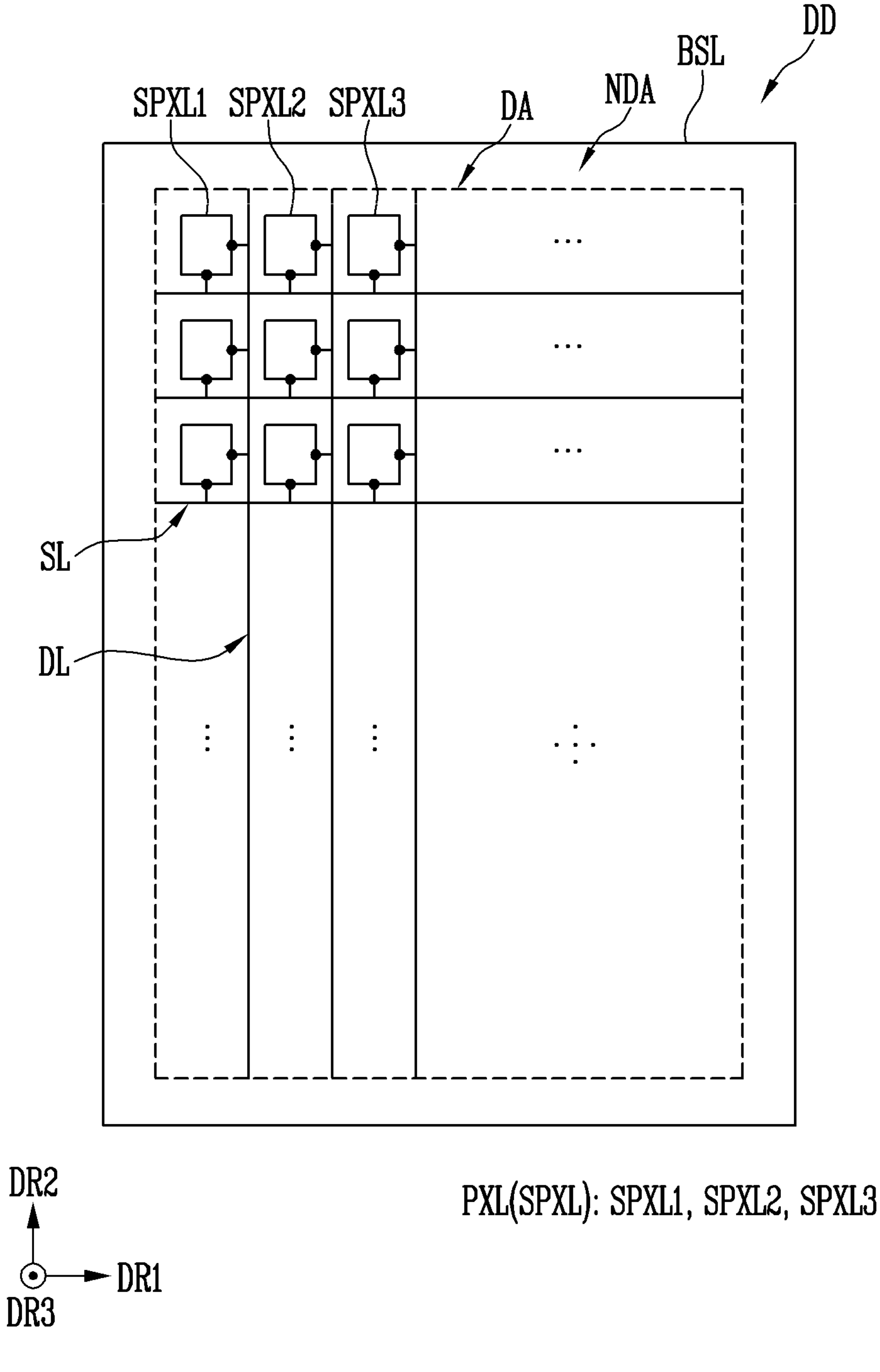
FIGS. 3 and 4 are schematic plan views illustrating a display device in accordance with an embodiment of the disclosure.
Figure 4:
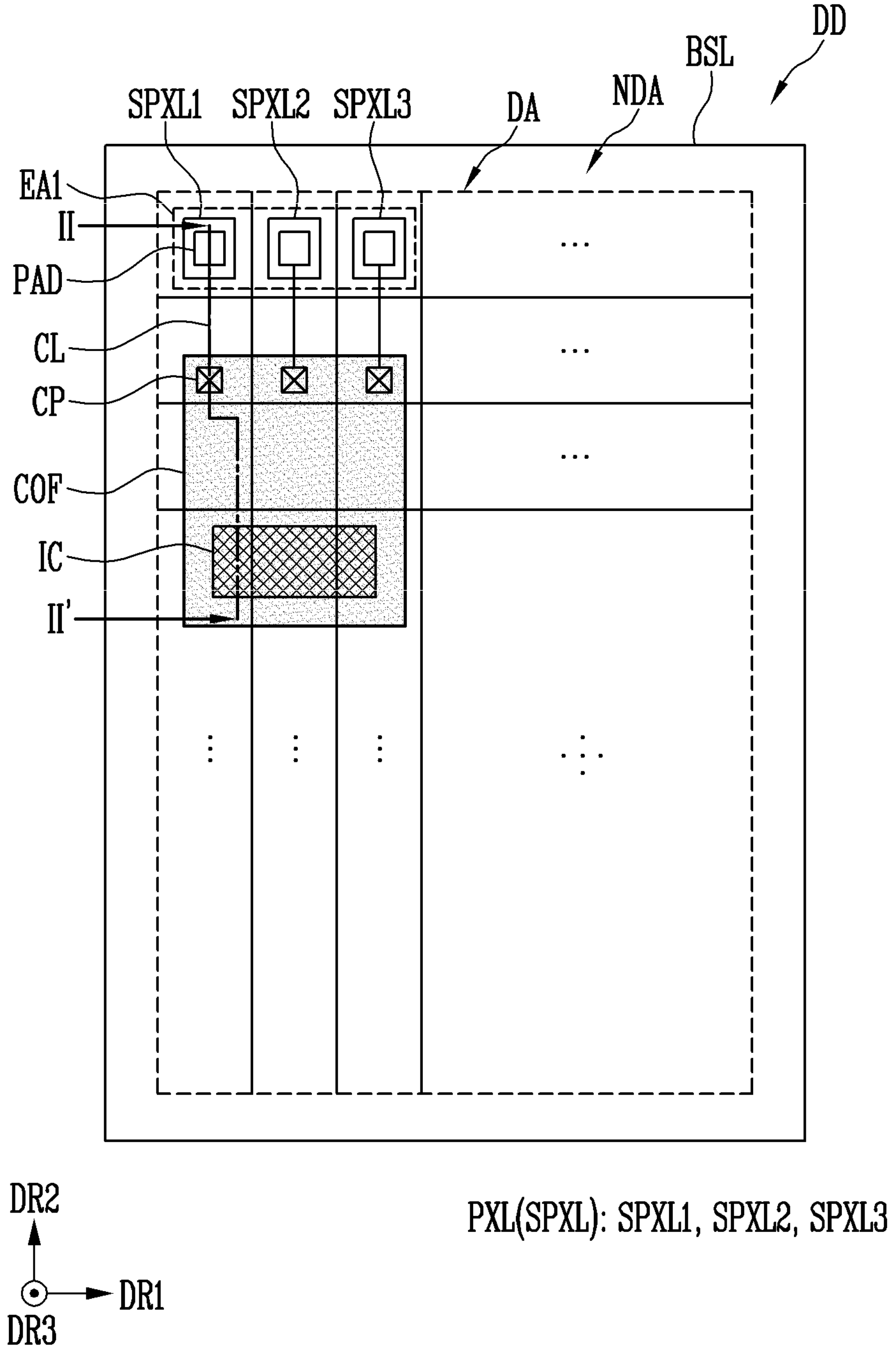
Figure 5:
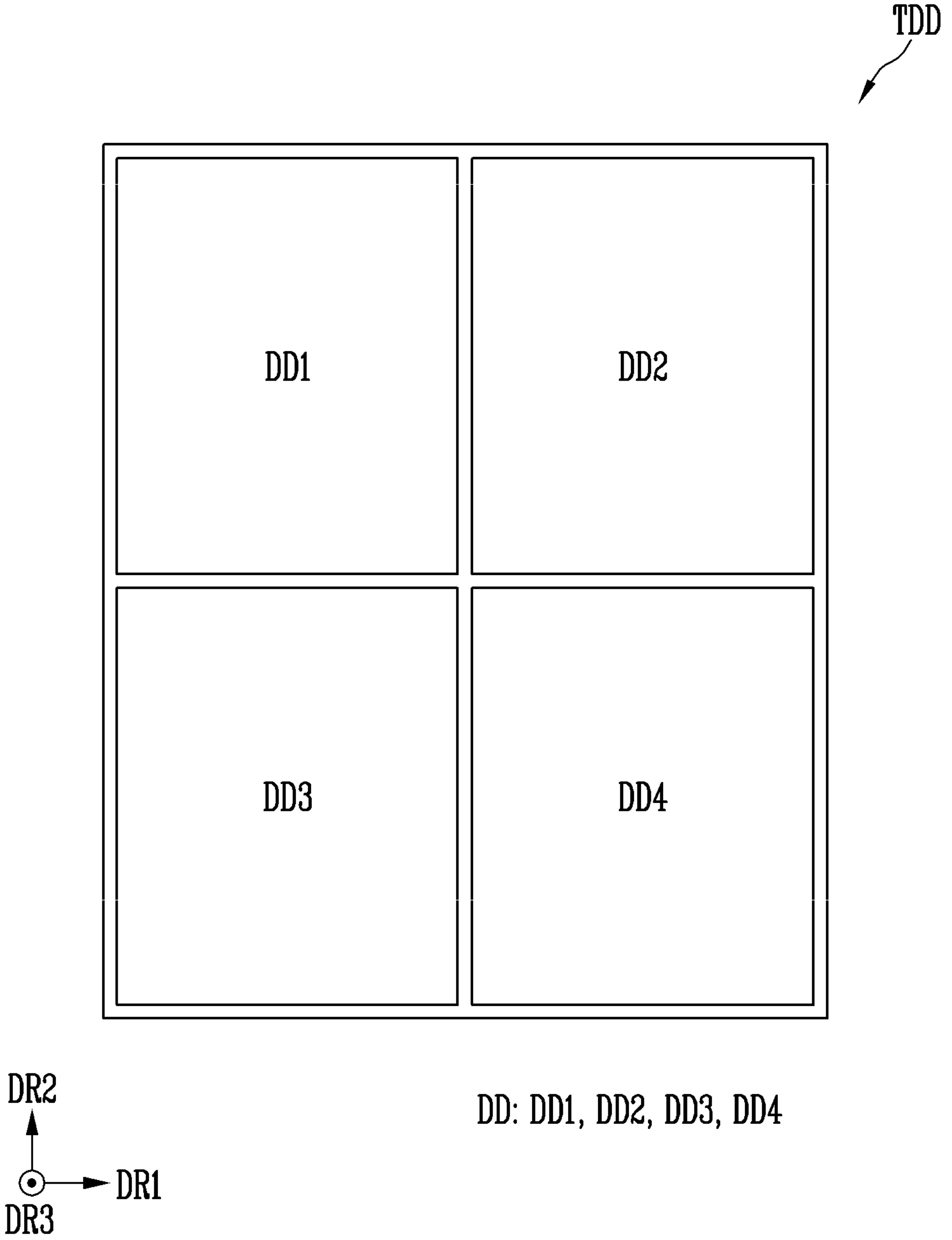
FIG. 5 is a schematic plan view illustrating a tiled display device including display devices in accordance with an embodiment of the disclosure.

FIGS. 3 and 4 are schematic plan views illustrating a display device in accordance with an embodiment of the disclosure. FIG. 5 is a schematic plan view illustrating a tiled display device including display devices in accordance with an embodiment of the disclosure.

Referring to FIGS. 3 and 4, the display device DD may include a base layer BSL and pixels PXL (or sub-pixels SPXL) disposed on the base layer BSL. The display device DD may also include a driving circuit (e.g., a data driver and a data driver) for driving the pixels PXL, scan lines SL, data lines DL, lines, and a pad PAD. The display device DD may also include a chip-on-film (COF), a driving chip IC, a connection part CP, and a connecting line CL.

The display device DD may include a display area DA and a non-display area NDA. The non-display area NDA may be an area other than the display area DA. The non-display area NDA may be disposed adjacent to at least a portion of the display area DA.

The base layer BSL may form a base member of the display device DD. The base layer BSL may include a rigid or flexible substrate or film. The material and/or property of the base layer BSL are/is not particularly limited.

In accordance with an embodiment, the base layer BSL may include multiple layers. For example, the base layer BSL may include a first base layer 120, barrier layers 140, blocking layers 160, and a second base layer 180 (see FIG. 9). A detailed structure of the base layer BSL will be described below.

The display area DA may be an area in which the pixels PXL (or the sub-pixels SPXL, or light emitting elements LD) are disposed. The non-display area NDA may be an area in which the pixels PXL are not disposed.

For example, the pixels PXL may be arranged in a stripe arrangement structure, a PENTILE™ arrangement structure, or the like. However, the disclosure is not limited thereto, and various embodiments may be applied in the disclosure.

In accordance with an embodiment, the pixel PXL may include a first sub-pixel SPXL1, a second sub-pixel SPXL2, and a third sub-pixel SPXL3. Each of the first sub-pixel SPXL1, the second sub-pixel SPXL2, and the third sub-pixel SPXL3 may be a sub-pixel. At least one of the first sub-pixel SPXL1, the second sub-pixel SPXL2, and the third sub-pixel SPXL3 may constitute one pixel unit capable of emitting lights of various colors. In this specification, the sub-pixel SPXL may be at least one of the first to third sub-pixels SPXL1, SPXL2, and SPXL3.

Each of the first sub-pixel SPXL1, the second sub-pixel SPXL2, and the third sub-pixel SPXL3 may emit light of a color. For example, the first sub-pixel SPXL1 may be a red pixel emitting light of red (e.g., a first color), the second sub-pixel SPXL2 may be a green pixel emitting light of green (e.g., a second color), and the third sub-pixel SPXL3 may be a blue pixel emitting light of blue (e.g., a third color). The color, kind, and/or number of the first, second, and third sub-pixels SPXL1, SPXL2, and SPXL3 constituting the pixel unit are not limited to a specific example.

The scan lines SL may be electrically connected to a scan driver disposed at a side of the display area DA (e.g., in the non-display area NDA). For example, the scan driver may be disposed in an area of the non-display area NDA, which is adjacent to the display area DA in a first direction DR1. However, the position of the scan driver is not limited to the above-described example. In some embodiments, the scan driver may be included in the driving chip IC which will be described below, or be separately provided on the chip-on-film COF. The scan lines SL may extend along pixel rows. For example, the scan lines SL may extend in the first direction DR1, and be spaced apart from each other in a second direction DR2. Each of the scan lines SL may be electrically connected to each of the pixels PXL (or the sub-pixels SPXL) in a pixel row.

The data lines DL may be electrically connected to a data driver included in the driving chip IC. In some embodiments, at least one data driver may be included in each driving chip IC. The data lines DL may extend along the pixel columns. For example, the data lines DL may extend in the second direction DR2, and be spaced apart from each other in the first direction DR1. Each of the data lines DL may be electrically connected to each of the pixels PXL (or the sub-pixels SPXL) in a pixel column.

The pad PAD may be provided in plural. The pads PAD may be disposed such that at least one pad corresponds to each of the sub-pixels SPXL. The pads PAD may be electrically connected to the chip-on-film COF and the driving chip IC through the connecting line CL and the connection part CP. For example, a data signal acquired (or output) from the data driver in the driving chip IC may be provided (or applied) to each of the pads PAD through the chip-on-film COF, the connection part CP, and the connecting line CL. A data signal provided to pads PAD may be provided (or applied) to a data line DL electrically connected to the pads PAD, and one data signal may be supplied to each of the sub-pixels SPXL.

In accordance with an embodiment, the pads PAD may overlap the display area DA in a plan view. For example, the pads PAD may overlap an area in which the pixel PXL is disposed (or defined) in a plan view.

The chip-on-film COF may provide (or form) an area in which the driving chip IC is disposed. The chip-on-film COF may be electrically connected to the pads PAD through the connection part CP and the connecting line CL, and be electrically connected to the driving chip IC. Accordingly, an electrical signal provided by the driving chip IC may be supplied to the pixel PXL through the chip-on-film COF.

A number of chip-on-films COF is not particularly limited. For example, the number of chip-on-films COF may be one or two or more. At least a portion of the chip-on-film COF may be disposed in the display area DA. The chip-on-film COF may be disposed in the display area DA. The chip-on-film COF may overlap the display area DA in a plan view. For example, the chip-on-film COF may be disposed on a rear surface of the base layer BSL in the display area DA of the display area DD.

In conjunction with FIG. 5, the display device DD may be provided in plural to form a tiled display device TDD. For example, in some embodiments, in case that the chip-on-film COF and the driving chip IC are disposed on the base layer BSL, it may readily manufacture the display device DD having a large display area DA, or it may readily minimize the non-display area NDA (e.g., to minimize a space). In some embodiments, in case that the tiled display device TDD for forming a large-area display surface is manufactured, the above-described structure may be applied. For example, the display device DD may include multiple display devices DD1, DD2, DD3, and DD4 which have structures corresponding to each other and are connected adjacent to each other.

In accordance with an embodiment, the chip-on-film COF may include an insulating film and multiple lines provided on the insulating film. The chip-on-film COF generally refers to a form in which an insulating film configured as a thin film and lines on the insulating film are formed, and may be designated as a tape carrier package, a flexible printed circuit board, or the like.

The driving chip IC may be disposed in the display area DA. A position of the driving chip IC may correspond to a position of at least a portion of the chip-on-film COF. The driving chip IC may overlap the display area DA in a plan view. The driving chip IC may be disposed on the rear surface of the base layer BSL. As described above, it may readily manufacture the display device DD having a large display area DA, and the non-display area NDA may be minimized.

The driving chip IC may include a data driver. The driving chip IC may output a data signal to the data line DL. In some embodiments, the driving chip IC may be disposed on the chip-on-film COF. In some embodiments, the driving chip IC may be mounted on the insulating film of the chip-on-film COF, to be electrically connected to at least a portion of the lines.

Figure 6:
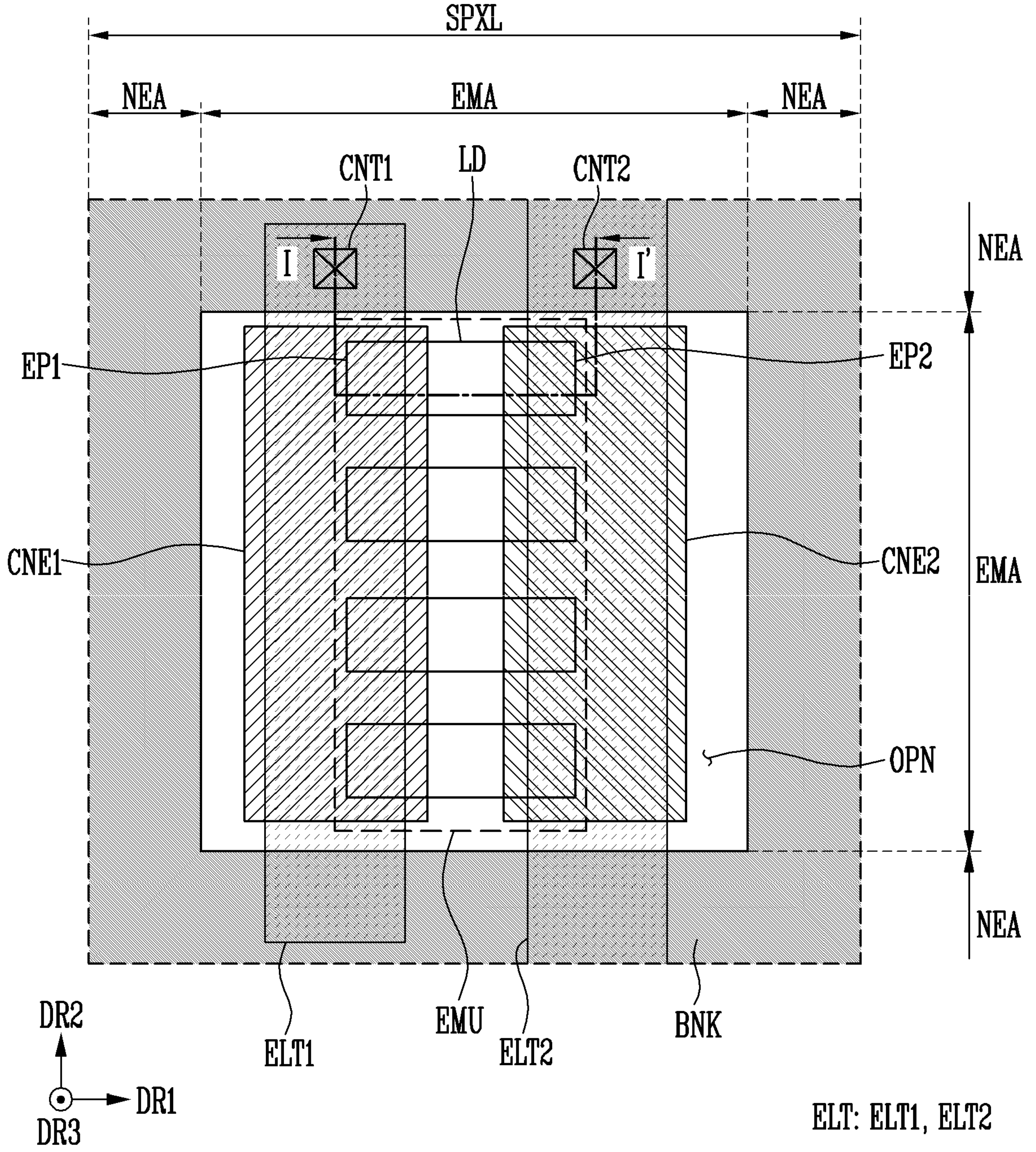
FIG. 6 is a schematic plan view illustrating a sub-pixel in accordance with an embodiment of the disclosure.
Figure 7:
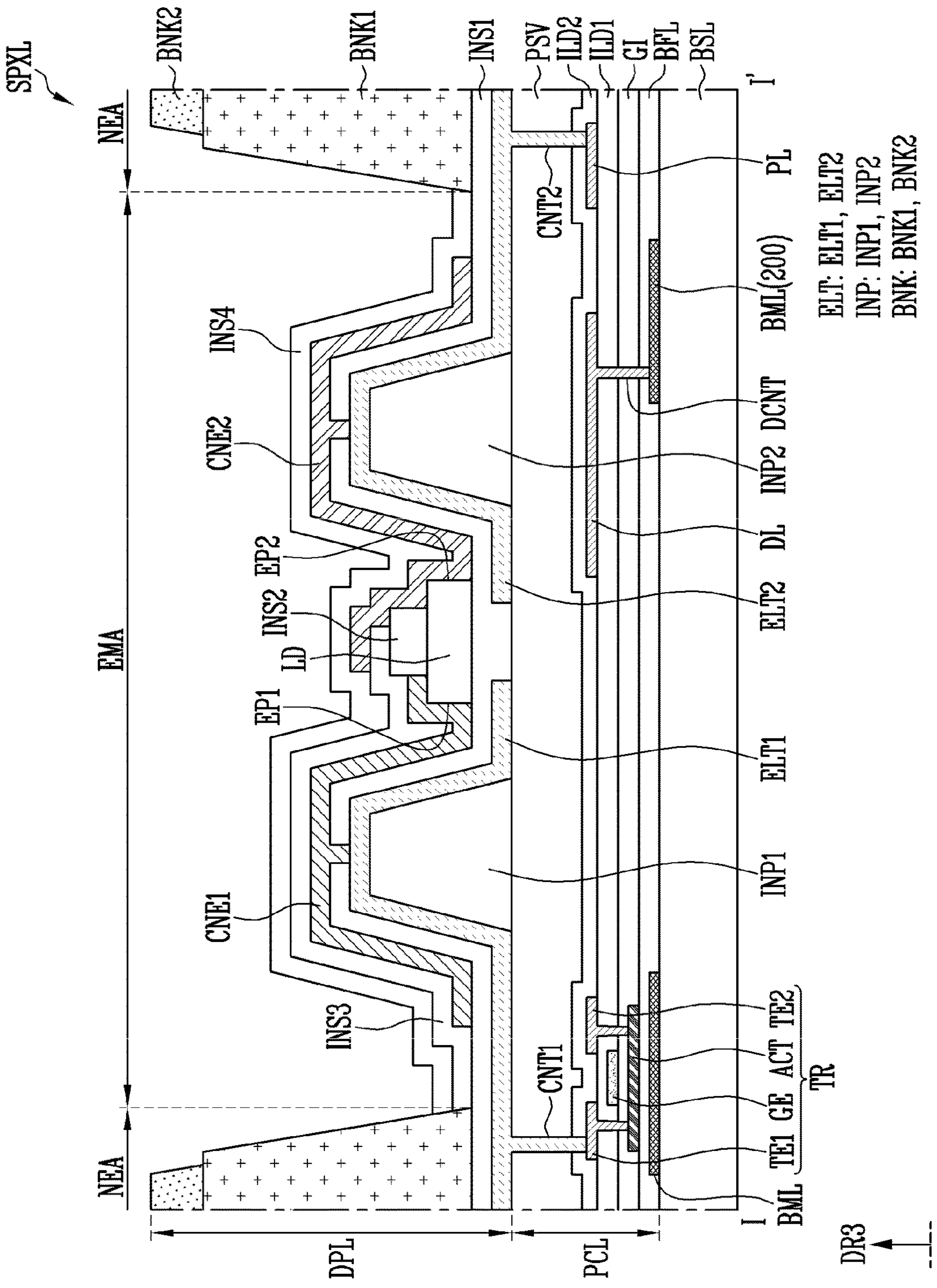
FIG. 7 is a schematic cross-sectional view illustrating a sub-pixel in accordance with an embodiment of the disclosure.
Figure 8:
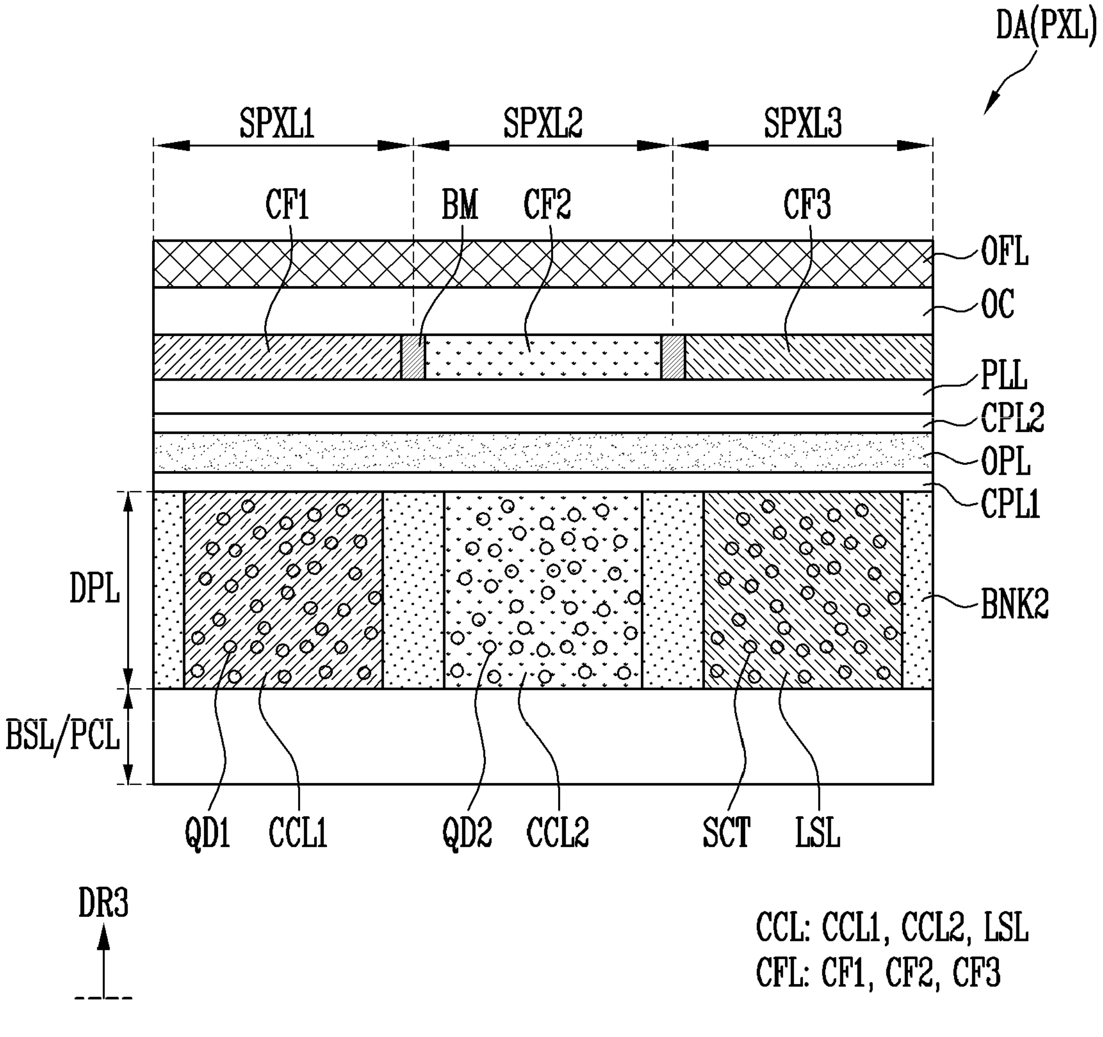
FIG. 8 is a schematic cross-sectional view illustrating a pixel in accordance with an embodiment of the disclosure.

Hereinafter, a structure of a pixel PXL (or a sub-pixel SPXL) in accordance with an embodiment of the disclosure will be described with reference to FIGS. 6 to 8. FIGS. 6 to 8 are views illustrating a pixel PXL (or a sub-pixel SPXL) in accordance with an embodiment of the disclosure. In FIGS. 6 to 8, descriptions of portions overlapping with the above-described portions will be simplified or will not be repeated.

First, a planar structure of a sub-pixel SPXL will be described with reference to FIG. 6. FIG. 6 is a schematic plan view illustrating a sub-pixel in accordance with an embodiment of the disclosure. The sub-pixel SPXL shown in FIG. 6 may be one of the first to third sub-pixels SPXL1, SPXL2, and SPXL3 described in FIGS. 3 and 4.

The sub-pixel SPXL may include an emission area EMA and a non-emission area NEA. The sub-pixel SPXL may include a bank BNK, an alignment electrode ELT, light emitting elements LD, a first contact electrode CNE1, and a second contact electrode CNE2.

The emission area EMA may overlap an opening OPN defined by the bank BNK in a plan view. The light emitting elements LD may be disposed in the emission area EMA.

The light emitting elements LD may not be disposed in the non-emission area NEA. A portion of the non-emission area NEA may overlap the bank BNK in a plan view.

The bank BNK may include (or provide) the opening OPN. For example, the bank BNK may have a shape protruding in a thickness direction of the base layer BSL (e.g., a third direction DR3), and have a form surrounding an area. Accordingly, the opening OPN in which the bank BNK is not disposed may be formed.

The bank BNK may form a space. The bank BNK may have a form surrounding a partial area in a plan view. The space may be an area in which a fluid can be accommodated. In accordance with an embodiment, the bank BNK may include a first bank (see 'BNK1' shown in FIG. 7) and a second bank (see 'BNK2' shown in FIG. 7).

In accordance with an embodiment, an ink including the light emitting elements LD may be provided in a space defined by the bank BNK (e.g., the first bank BNK1), so that the light emitting elements LD are disposed in the opening OPN.

In accordance with an embodiment, a color conversion layer (see 'CCL' shown in FIG. 8) may be disposed (or patterned) in a space defined by the bank BNK (e.g., the second bank BNK2).

The alignment electrode ELT may be an electrode for aligning the light emitting elements LD. In some embodiments, the alignment electrode ELT may include a first electrode ELT1 and a second electrode ELT2. The alignment electrode ELT may be referred to as an "electrode" or "electrodes."

The alignment electrode ELT may have a single layer structure or a multi-layer structure. For example, the alignment electrode ELT may include at least one reflective electrode layer including a reflective conductive material, and may further include at least one transparent electrode layer and/or at least one conductive capping layer. In some embodiments, the alignment electrode ELT may include at least one of silver (Al), magnesium (Mg), aluminum (Al), platinum (Pt), palladium (Pd), gold (Au), nickel (Ni), neodymium (Nd), iridium (Ir), chromium (Cr), titanium (Ti), and any alloy thereof. However, the disclosure is not limited to the above-described example, and the alignment electrode ELT may include various materials having reflexibility.

The light emitting element LD may be disposed on the alignment electrode ELT. In some embodiments, at least a portion of the light emitting element LD may be disposed between the first electrode ELT1 and the second electrode ELT2. The light emitting element LD may be aligned between the first electrode ELT1 and the second electrode ELT2. The light emitting elements LD may form (or constitute) a light emitting unit EMU. The light emitting unit EMU may be a unit including multiple light emitting elements LD.

In some embodiments, the light emitting elements LD may be aligned in various manners. For example, an embodiment in which the light emitting elements LD are aligned in parallel between the first electrode ELT1 and the second electrode ELT2 is illustrated in FIG. 6. However, the disclosure is not necessarily limited to the above-described example. For example, the light emitting elements LD may be aligned in a series or series/parallel hybrid structure, and the number of units connected in series and/or parallel is not particularly limited.

The first electrode ELT1 and the second electrode ELT2 may be spaced apart from each other. For example, the first electrode ELT1 and the second electrode ELT2 may be space apart from each other in the first direction DR1 in the emission area EMA, and each of the first electrode ELT1 and the second electrode ELT2 may extend in the second direction DR2.

In accordance with an embodiment, the first electrode ELT1 and the second electrode ELT2 may be electrodes for aligning the light emitting elements LD. The first electrode ELT1 may be a first alignment electrode, and the second electrode ELT2 may be a second alignment electrode.

The first electrode ELT1 and the second electrode ELT2 may be respectively supplied (or provided) with a first alignment signal and a second alignment signal in a process of aligning the light emitting elements LD. For example, the ink including the light emitting elements LD may be supplied (or provided) to the opening OPN defined by the bank BNK (e.g., the first bank BNK1), the first alignment signal may be supplied to the first electrode ELT1, and the second alignment signal may be supplied to the second electrode ELT2. The first alignment signal and the second alignment signal may have different waveforms, different potentials, and/or different phases. For example, the first alignment signal may be an AC signal, and the second alignment signal may be a ground signal. However, the disclosure is not necessarily limited to the above-described example. An electric field may be formed between (or on) the first electrode ELT1 and the second electrode ELT2, so that the light emitting elements LD are aligned between the first electrode ELT1 and the second electrode ELT2, based on the electric field. For example, the light emitting elements LD may be moved (or rotated) by a force (a dielectrophoresis (DEP) force) according to the electric field to be aligned (or disposed) on the alignment electrode ELT.

The first electrode ELT1 may be electrically connected to a circuit element (e.g., a transistor (see 'TR' shown in FIG. 7)) through a first contact member CNT1. In some embodiments, the first electrode ELT1 may provide an anode signal for allowing the light emitting element LD to emit light. The first electrode ELT1 may provide the first alignment signal for aligning the light emitting element LD.

The second electrode ELT2 may be electrically connected to a power line (see 'PL' shown in FIG. 7) through a second contact member CNT2. In some embodiments, the second electrode ELT2 may provide a cathode signal for allowing the light emitting element LD to emit light. The second electrode ELT2 may provide the second alignment signal for aligning the light emitting element LD.

The positions of the first contact member CNT1 and the second contact member CNT2 are not limited to positions shown in FIG. 6, and may be appropriately variously changed.

The light emitting element LD may emit light, based on an electrical signal provided thereto. For example, the light emitting element LD may provide light, based on a first electrical signal (e.g., the anode signal) provided from the first contact electrode CNE1 and a second electrical signal (e.g., the cathode signal) provided from the second contact electrode CNE2.

A first end portion EP1 of the light emitting element LD may be disposed adjacent to the first electrode ELT1, and a second end portion EP2 may be disposed adjacent to the second electrode ELT2. The first end portion EP1 may or may not overlap the first electrode ELT1 in a plan view. The second end portion EP2 may or may not overlap the second electrode ELT2 in a plan view.

In accordance with an embodiment, the first end portion EP1 of each of the light emitting elements LD may be electrically connected to the first electrode ELT1 through the first contact electrode CNE1. In another embodiment, the first end portion EP1 of each of the light emitting elements LD may be directly connected to the first electrode ELT1. In still another embodiment, the first end portion EP1 of each of the light emitting elements LD may be electrically connected to only the first contact electrode CNE1, and may not be electrically connected to the first electrode ELT1.

Similarly, the second end portion EP2 of each of the light emitting elements LD may be electrically connected to the second electrode ELT2 through the second contact electrode CNE2. In another embodiment, the second end portion EP2 of each of the light emitting elements LD may be directly connected to the second electrode ELT2. In still another embodiment, the second end portion EP2 of each of the light emitting elements LD may be electrically connected to only the second contact electrode CNE2, and may not be electrically connected to the second electrode ELT2.

The first contact electrode CNE1 and the second contact electrode CNE2 may be respectively disposed on the first end portions EP1 and the second end portions EP2 of the light emitting elements LD.

The first contact electrode CNE1 may be disposed on the first end portions EP1 of the light emitting elements LD to be electrically connected to the first end portions EP1. In an embodiment, the first contact electrode CNE1 may be disposed on the first electrode ELT1 to be electrically connected to the first electrode ELT1. The first end portions EP1 of the light emitting elements LD may be connected to the first electrode ELT1 through the first contact electrode CNE1.

The second contact electrode CNE2 may be disposed on the second end portions EP2 of the light emitting elements LD to be electrically connected to the second end portions EP2. In an embodiment, the second contact electrode CNE2 may be disposed on the second electrode ELT2 to be electrically connected to the second electrode ELT2. The second end portions EP2 of the light emitting elements LD may be connected to the second electrode ELT2 through the second contact electrode CNE2.

A cross-sectional structure of a pixel PXL (or sub-pixel SPXL) will be described with reference to FIGS. 7 and 8. For example, a pixel circuit layer PCL and a display element layer DPL of the sub-pixel SPXL will be described with reference to FIG. 7. An optical layer OPL, a color filter layer CFL, and an outer film layer OFL will be described with reference to FIG. 8. In FIGS. 7 and 8, descriptions of portions overlapping with those described above will be simplified or will not be repeated.

FIG. 7 is a schematic cross-sectional view illustrating a sub-pixel in accordance with an embodiment of the disclosure. FIG. 8 is a schematic cross-sectional view illustrating a pixel in accordance with an embodiment of the disclosure.

Referring to FIG. 7, the sub-pixel SPXL may be disposed on a base layer BSL. The sub-pixel SPXL may include a pixel circuit layer PCL and a display element layer DPL.

The base layer BSL may form a base member on which the sub-pixel SPXL is formed. The base layer BSL may provide an area on which the pixel circuit layer PCL and the display element layer DPL can be disposed.

The pixel circuit layer PCL may be disposed on the base layer BSL. The pixel circuit layer PCL may include a lower auxiliary electrode BML, a buffer layer BFL, a transistor TR, a gate insulating layer GI, a first interlayer insulating layer ILD1, a power line PL, data lines DL, a second interlayer insulating layer ILD2, and a protective layer PSV.

The lower auxiliary electrode BML may be disposed on the base layer BSL. The lower auxiliary electrode BML may include a lower connection electrode 200. The lower connection electrode 200 may be covered by the buffer layer BFL. The lower connection electrode 200 may serve as a path through which a data signal is transferred. For example, the lower connection electrode 200 may be electrically connected to pads PAD to be supplied with a data signal, and be electrically connected to the data line DL through a data contact member DCNT penetrating layers (e.g., the buffer layer BFL, the gate insulating layer GI, and the first interlayer insulating layer ILD1) of the pixel circuit layer PCL.

The buffer layer BFL may be disposed on the base layer BSL. The buffer layer BFL may cover the lower auxiliary electrode BML. The buffer layer BFL may prevent an impurity from being diffused from the outside. The buffer layer BFL may include at least one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The transistor TR may be a thin film transistor. In accordance with an embodiment, the transistor TR may be a driving transistor. The transistor TR may be electrically connected to a light emitting element LD. The transistor TR may be electrically connected to a first end portion EP1 of the light emitting element LD.

The transistor TR may include an active layer ACT, a first transistor electrode TE1, a second transistor electrode TE2, and a gate electrode GE.

The active layer ACT may be a semiconductor layer. The active layer ACT may be disposed on the buffer layer BFL. The active layer ACT may include at least one selected from the group consisting of a polycrystalline silicon, a Low Temperature Polycrystalline Silicon (LTPS), an amorphous silicon, and an oxide semiconductor.

The active layer ACT may include a first contact region in contact with the first transistor electrode TE1 and a second contact region in contact with the second transistor electrode TE2. The first contact region and the second contact region may be a semiconductor pattern doped with an impurity. A region between the first contact region and the second contact region may be a channel region. The channel region may be an intrinsic semiconductor pattern undoped with an impurity.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween.

The gate insulating layer GI may be disposed on the buffer layer BFL. The gate insulating layer GI may cover the active layer ACT. The gate insulating layer GI may include at least one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The first interlayer insulating layer ILD1 may be disposed on the gate insulating layer GI. The first interlayer insulating layer ILD1 may cover the gate electrode GE. The first interlayer insulating layer ILD1 may include at least one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not necessarily limited to the above-described example.

The first transistor electrode TE1 and the second transistor electrode TE2 may be disposed on the first interlayer insulating layer ILD1. The first transistor electrode TE1 may be in contact with the first contact region of the active layer ACT while penetrating the gate insulating layer GI and the first interlayer insulating layer ILD1, and the second transistor electrode TE2 may be in contact with the second contact region of the active layer ACT while penetrating the gate insulating layer GI and the first interlayer insulating layer ILD1. For example, the first transistor electrode TE1 may be a drain electrode, and the second transistor electrode TE2 may be a source electrode. However, the disclosure is not limited thereto.

The first transistor electrode TE1 may be electrically connected to a first electrode ELT1 through a first contact member CNT1 penetrating the protective layer PSV and the second interlayer insulating layer ILD2.

The power line PL may be disposed on the first interlayer insulating layer ILD1. In some embodiments, the power line PL, the data lines DL, the first transistor electrode TE1, and the second transistor TE2 may be disposed in a same layer. The power line PL may be electrically connected to a second electrode ELT2 through a second contact member CNT2. The power line PL may supply a power or an alignment signal through the second electrode ELT2.

The data lines DL may be disposed on the first interlayer insulating layer ILD1. In some embodiments, the data lines DL, the power line PL, the first transistor electrode TE1, and the second transistor electrode TE2 may be disposed in a same layer. The data lines DL may be electrically connected to the lower connection electrode 200 through the data contact member DCNT. The data lines DL may be supplied with a data signal through the lower connection electrode 200.

The second interlayer insulating layer ILD2 may be disposed on the first interlayer insulating layer ILD1. The second interlayer insulating layer ILD2 may cover the first transistor electrode TE1, the second transistor electrode TE2, the data lines DL, and the power line PL. The second interlayer insulating layer ILD2 may include at least one of silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited to the above-described example.

The protective layer PSV may be disposed on the second interlayer insulating layer ILD2. In some embodiments, the protective layer PSV may be a via layer. The protective layer PSV may include an organic material to planarize a lower step difference. For example, the protective layer PSV may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto, and the protective layer PSV may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

In accordance with an embodiment, the sub-pixel SPXL may include the first contact member CNT1 and the second contact member CNT2. The first contact member CNT1 and the second contact member CNT2 may penetrate the second interlayer insulating layer ILD2, the protective layer PSV, and a first insulating layer INS1 (or a first insulating reflective layer 120). The first electrode ELT1 and the first transistor electrode TE1 may be electrically connected to each other through the first contact member CNT1. The second electrode ELT2 and the power line PL may be electrically connected to each other through the second contact member CNT2.

The display element layer DPL may be disposed on the pixel circuit layer PCL. The display element layer DPL may include a first insulating layer INS1, an insulating pattern INP, an alignment electrode ELT, a bank BNK, the light emitting element LD, a second insulating layer INS2, a first contact electrode CNE1, a third insulating layer INS3, a second contact electrode CNE2, and a fourth insulating layer INS4.

The insulating pattern INP may be formed on the protective layer PSV. The insulating pattern INP may have various shapes. In an embodiment, the insulating pattern INP may protrude in the thickness direction of the base layer BSL (e.g., the third direction DR3). The insulating pattern INP may be formed to have an inclined surface inclined with an angle with respect to the base layer BSL. However, the disclosure is not necessarily limited thereto, and the insulating pattern INP may have a sidewall with a curved shape, a stepped shape, or the like. For example, the insulating pattern INP may have having a semicircular shape, a semi-elliptical shape, or the like in a cross-sectional view.

The insulating pattern INP may form a step difference such that light emitting elements LD can be readily aligned in the emission area. In some embodiments, the insulating pattern INP may be a partition wall.

In accordance with an embodiment, a portion of the alignment electrode ELT may be disposed on the insulating pattern INP. For example, the insulating pattern INP may include a first insulating pattern INP1 and a second insulating pattern INP2. The first electrode ELT1 may be disposed on the first insulating pattern INP1, and the second electrode ELT2 may be disposed on the second insulating pattern INP2. Therefore, a reflective wall may be formed on the insulating pattern INP. Accordingly, light emitted from the light emitting element LD may be recycled, so that the light emission efficiency of the display device DD (or the pixel PXL) can be improved.

The insulating pattern INP may include at least one organic material and/or at least one inorganic material. For example, the insulating pattern INP may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto, and the insulating pattern INP may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The alignment electrode ELT may be disposed on the protective layer PSV and/or the insulating pattern INP. As described above, a portion of the alignment electrode ELT may be disposed on the insulating pattern INP, to form a reflective wall. An alignment signal (e.g., an AC signal or a ground signal) for aligning the light emitting element LD may be supplied to the alignment electrode ELT. In some embodiments, an electrical signal (e.g., an anode signal and a cathode signal) for allowing the light emitting element LD to emit light may be supplied to the alignment electrode ELT.

In accordance with an embodiment, the alignment electrode ELT may be disposed on a rear surface of the first insulating layer INS1. For example, the alignment electrode ELT may be disposed between the insulating pattern INP or the protective layer PSV and the first insulating layer INS1. For example, a surface of the alignment electrode ELT may be in contact with the first insulating layer INS1.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may apply an anode signal for allowing the light emitting element LD to emit light.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may apply a cathode signal (e.g., a ground signal) for allowing the light emitting element LD to emit light.

The first insulating layer INS1 may be disposed on the alignment electrode ELT. For example, the first insulating layer INS1 may cover the first electrode ELT1 and the second electrode ELT2.

The bank BNK may be disposed on the first insulating layer INS1. In some embodiments, the bank BNK may include a first bank BNK1 and a second bank BNK2.

The first bank BNK1 may be disposed on the first insulating layer INS1. In some embodiments, in a plan view, the first bank BNK1 may not overlap the emission area EMA, and may overlap the non-emission area NEA. As described above, the first bank BNK1 may protrude in the thickness direction of the base layer BSL (e.g., the third direction DR3), thereby defining an opening OPN, and a space in which the light emitting elements LD can be provided may be formed in the opening OPN in a process of supplying the light emitting elements LD.

The first bank BNK1 may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto, and the first bank BNK1 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The second bank BNK2 may be disposed on the first bank BNK1. The second bank BNK2 may protrude in the thickness direction of the base layer BSL (e.g., the third direction DR3), thereby defining an opening OPN, and a space in which a color conversion layer CCL is provided may be formed in the opening OPN.

The second bank BNK2 may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto, and the second bank BNK2 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The light emitting element LD may be disposed on the first insulating layer INS1. In some embodiments, the light emitting element LD may emit light, based on electrical signals (e.g., an anode signal and a cathode signal) provided from the first contact electrode CNE1 and the second contact electrode CNE2.

The light emitting element LD may be disposed in an area surrounded by the first bank BNK1. The light emitting element LD may be disposed between the first insulating pattern INP1 and the second insulating pattern INP2.

The second insulating layer INS2 may be disposed on the light emitting element LD. The second insulating layer INS2 may cover an active layer AL of the light emitting element LD.

The second insulating layer INS2 may expose at least a portion of the light emitting element LD. For example, the second insulating layer INS2 may not cover the first end portion EP1 and a second end portion EP2 of the light emitting element LD. Accordingly, the first end portion EP1 and the second end portion EP2 of the light emitting element LD can be exposed, and be respectively connected to the first contact electrode CNE1 and the second contact electrode CNE2.

As the second insulating layer INS2 is formed on light emitting elements LD after the light emitting elements LD are completely aligned, the light emitting elements LD can be prevented from being separated from positions at which the light emitting elements LD are aligned.

The second insulating layer INS2 may have a single-layer structure or a multi-layer structure. The second insulating layer INS2 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the disclosure is not limited to the above-described example.

The first contact electrode CNE1 and the second contact electrode CNE2 may be disposed on the first insulating layer INS1. The first contact electrode CNE1 may be electrically connected to the first end portion EP1 of the light emitting element LD. The second contact electrode CNE2 may be electrically connected to the second end portion EP2 of the light emitting element LD.

The first contact electrode CNE1 may be electrically connected to the first electrode ELT1 through a contact hole penetrating the first insulating layer INS1, and the second contact electrode CNE2 may be electrically connected to the second electrode ELT2 through a contact hole penetrating the first insulating layer INS1.

The first contact electrode CNE1 and the second contact electrode CNE2 may include a conductive material. For example, the first contact electrode CNE1 and the second contact electrode CNE2 may include a transparent conductive material including at least one of Indium Tin Oxide (ITO), Indium Zinc Oxide (IZO), and Indium Tin Zinc Oxide (ITZO). Accordingly, light emitted from the light emitting elements LD may be emitted to the outside of the display device DD after passing through the first and second contact electrodes CNE1 and CNE2. However, the disclosure is not necessarily limited to the above-described example.

In accordance with an embodiment, after one of the first contact electrode CNE1 and the second contact electrode CNE2 is patterned, another one of the first contact electrode CNE1 and the second contact electrode CNE2 may be patterned. However, the disclosure is not necessarily limited to the above-described example. The first contact electrode CNE1 and the second contact electrode CNE2 may be patterned at a same time through a same process.

The third insulating layer INS3 may be disposed on the first insulating layer INS1 and the first contact electrode CNE1. At least a portion of the third insulating layer INS3 may be disposed between the first contact electrode CNE1 and the second contact electrode CNE2, and accordingly, a short-circuit defect between the first contact electrode CNE1 and the second contact electrode CNE2 may be prevented.

The fourth insulating layer INS4 may be disposed on the third insulating layer INS3 and the second contact electrode CNE2. The fourth insulating layer INS4 may protect components of the display element layer DPL from external influence.

Each of the third insulating layer INS3 and the fourth insulating layer INS4 may have a single-layer structure or a multi-layer structure. The third insulating layer INS3 and the fourth insulating layer INS4 may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

Components of the pixel PXL including the color conversion layer CCL will be described with reference to FIG. 8. FIG. 8 illustrates the color conversion layer CCL, an optical layer OPL, a color filter layer CFL, and the like. For convenience of descriptions, components in the pixel circuit layer PCL and the display element layer DPL among the above-described components except the second bank BNK2 will be omitted in FIG. 8.

Referring to FIG. 8, the second bank BNK2 may be disposed between first to third sub-pixels SPXL1, SPXL2, and SPXL3 or at a boundary of the first to third sub-pixels SPXL1, SPXL2, and SPXL3, and define a space (or area) overlapping each of the first to third sub-pixels SPXL1, SPXL2, and SPXL3. The space defined by the second bank BNK2 may be an area in which the color conversion layer CCL can be provided.

The color conversion layer CCL may be disposed above light emitting elements LD in the space surrounded by the second bank BNK2. The color conversion layer CCL may include a first color conversion layer CCL1 disposed in the first sub-pixel SPXL1, a second color conversion layer CCL2 disposed in the second sub-pixel SPXL2, and a light scattering layer LSL disposed in the third sub-pixel SPXL3.

The color conversion layer CCL may be disposed above the light emitting element LD. The color conversion layer CCL may change a wavelength of light. In an embodiment, the first to third sub-pixels SPXL1, SPXL2, and SPXL3 may include light emitting elements LD emitting light of a same color. For example, the first to third sub-pixels SPXL1, SPXL2, and SPXL3 may include light emitting elements LD emitting light of a third color (or blue). The color conversion layer CCL including color conversion particles may be disposed in each of the first to third sub-pixels SPXL1, SPXL2, and SPXL3, so that a full-color image can be displayed.

The first color conversion layer CCL1 may include first color conversion particles for converting light of the third color, which is emitted from the light emitting element LD, into light of a first color. For example, the first color conversion layer CCL1 may include multiple first quantum dots QD1 dispersed in a matrix material such as base resin.

In an embodiment, in case that the light emitting element LD is a blue light emitting element emitting light of blue, and the first sub-pixel SPXL1 is a red pixel, the first color conversion layer CCL1 may include a first quantum dot QD1 for converting light of blue, which is emitted from the blue light emitting element, into light of red. The first quantum dot QD1 may absorb blue light and emit red light by shifting a wavelength of the blue light by energy transition. In case that the first sub-pixel SPXL1 is a pixel of another color, the first color conversion layer CCL1 may include a first quantum dot QD1 corresponding to the color of the first sub-pixel SPXL1.

The second color conversion layer CCL2 may include second color conversion particles for converting light of the third color, which is emitted from the light emitting element LD, into light of a second color. For example, the second color conversion layer CCL2 may include multiple second quantum dots QD2 dispersed in a matrix material such as base resin.

In an embodiment, in case that the light emitting element LD is a blue light emitting element emitting light of blue, and the second sub-pixel PXL2 is a green pixel, the second color conversion layer CCL2 may include a second quantum dot QD2 for converting light of blue, which is emitted from the blue light emitting element, into light of green. The second quantum dot QD2 may absorb blue light and emit green light by shifting a wavelength of the blue light by energy transition. In case that the second sub-pixel PXL2 is a pixel of another color, the second color conversion layer CCL2 may include a second quantum dot QD2 corresponding to the color of the second sub-pixel PXL2.

In an embodiment, light of blue having a relatively short wavelength in a visible light band may be incident into the first quantum dot QD1 and the second quantum dot QD2, so that absorption coefficients of the first quantum dot QD1 and the second quantum dot QD2 can be increased. Accordingly, the efficiency of light finally emitted from the first sub-pixel SPXL1 and the second sub-pixel SPXL2 may be improved, and excellent color reproduction may be ensured. The light emitting unit EMU of each of the first to third sub-pixels SPXL1, SPXL2, and SPXL3 may be configured by using light emitting elements of a same color (e.g., blue light emitting elements), so that the manufacturing efficiency of the display device can be improved.

The light scattering layer LSL may be provided to efficiently use light of the third color (or blue), which is emitted from the light emitting element LD. For example, in case that the light emitting element LD is a blue light emitting element emitting light of blue, and the third sub-pixel SPXL3 is a blue pixel, the light scattering layer LSL may include at least one kind of light scattering particle SCT to efficiently use light emitted from the light emitting element LD. For example, the light scattering particle SCT of the light scattering layer LSL may include at least one of barium sulfate ($BaSO_4$), calcium carbonate ($CaCO_3$), titanium oxide ($TiO_2$), silicon oxide ($SiO_2$), aluminum oxide ($Al_2O_3$), zirconium oxide ($ZrO_2$), and zinc oxide (ZnO). The light scattering particle SCT may be disposed in the third sub-pixel SPXL3, and may be also included in the first color conversion layer CCL1 or the second color conversion layer CCL2. In some embodiments, the light scattering particle SCT may be omitted such that the light scattering layer LSL configured with transparent polymer is provided.

A first capping layer CPL1 may be disposed on the color conversion layer CCL. The first capping layer CPL1 may be provided throughout the first to third sub-pixels SPXL1, SPXL2, and SPXL3. The first capping layer CPL1 may cover the color conversion layer CCL. The first capping layer CPL1 may prevent the color conversion layer CCL from being damaged or contaminated due to infiltration of an impurity such as moisture or air from the outside.

The first capping layer CPL1 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), or the like.

The optical layer OPL may be disposed on the first capping layer CPL. The optical layer OPL may improve light extraction efficiency by recycling light provided from the color conversion layer CCL by total reflection. The optical layer OPL may have a refractive index relatively lower than a refractive index of the color conversion layer CCL. For example, the refractive index of the color conversion layer may be in a range of about 1.6 to about 2.0, and the refractive index of the optical layer OPL may be in a range of about 1.1 to about 1.3.

A second capping layer CPL2 may be disposed on the optical layer OPL. The second capping layer CPL2 may be provided throughout the first to third sub-pixels SPXL1, SPXL2, and SPXL3. The second capping layer CPL2 may cover the optical layer OPL. The second capping layer CPL2 may prevent the optical layer OPL from being damaged or contaminated due to infiltration of an impurity such as moisture or air from the outside.

The second capping layer CPL2 may be an inorganic layer, and may include silicon nitride ($SiN_x$), aluminum nitride ($AlN_x$), titanium nitride ($TiN_x$), silicon oxide ($SiO_x$), aluminum oxide ($AlO_x$), titanium oxide ($TiO_x$), silicon oxycarbide ($SiO_xC_y$), silicon oxynitride ($SiO_xN_y$), or the like.

A planarization layer PLL may be disposed on the second capping layer CPL2. The planarization layer PLL may be provided throughout the first to third sub-pixels SPXL1, SPXL2, and SPXL3.

The planarization layer PLL may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto, and the planarization layer PLL may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The color filter layer CFL may be disposed on the planarization layer PLL. The color filter layer CFL may include color filters CF1, CF2, and CF3 which accord with a color of each pixel PXL. The color filters CF1, CF2, and CF3 which accord with a color of each of the first to third sub-pixels SPXL1, SPXL2, and SPXL3 may be disposed, so that a full-color image can be displayed.

The color filter layer CFL may include a first color filter CF1 disposed in the first sub-pixel SPXL1 to allow light emitted from the first sub-pixel SPXL1 to be selectively transmitted therethrough, a second color filter CF2 disposed in the second sub-pixel SPXL2 to allow light emitted from the second sub-pixel SPXL2 to be selectively transmitted therethrough, and a third color filter CF3 disposed in the third sub-pixel SPXL3 to allow light emitted from the third sub-pixel SPXL3 to be selectively transmitted therethrough.

In an embodiment, the first color filter CF1, the second color filter CF2, and the third color filter CF3 may be respectively a red color filter, a green color filter, and a blue color filter, but the disclosure is not necessarily limited thereto. Hereinafter, in case that an color filter among the first color filter CF1, the second color filter CF2, and the third color filter CF3 is referenced or in case that two or more kinds of color filters are inclusively referenced, the corresponding color filter or the corresponding color filters are referred to as a "color filter CF" or "color filters CF".

The first color filter CF1 may overlap the first color conversion layer CCL1 in the thickness direction of the base layer BSL (e.g., the third direction DR3). The first color filter CF1 may include a color filter material for allowing light of a first color (or red) to be selectively transmitted therethrough. For example, in case that the first sub-pixel SPXL1 is a red pixel, the first color filter CF1 may include a red color filter material.

The second color filter CF2 may overlap the second color conversion layer CCL2 in the thickness direction of the base layer BSL (e.g., the third direction DR3). The second color filter CF2 may include a color filter material for allowing light of a second color (or green) to be selectively transmitted therethrough. For example, in case that the second sub-pixel SPXL2 is a green pixel, the second color filter CF2 may include a green color filter material.

The third color filter CF3 may overlap the light scattering layer LSL in the thickness direction of the base layer BSL (e.g., the third direction DR3). The third color filter CF3 may include a color filter material for allowing light of a third color (or blue) to be selectively transmitted therethrough. For example, in case that the third sub-pixel SPXL3 is a blue pixel, the third color filter CF3 may include a blue color filter material.

In some embodiments, a light blocking layer BM may be disposed between the first to third color filters CF1, CF2, and CF3. As described above, in case that the light blocking layer BM is formed between the first to third color filters CF1, CF2, and CF3, a color mixture defect viewed at the front or side of the display device DD may be prevented. The material of the light blocking layer BM is not particularly limited, and the light blocking layer BM may be configured with various light blocking materials. For example, the light blocking layer BM may be implemented by stacking the first to third color filters CF1, CF2, and CF3 each other.

An overcoat layer OC may be disposed on the color filter layer CFL. The overcoat layer OC may be provided throughout the first to third sub-pixels SPXL1, SPXL2, and SPXL3. The overcoat layer OC may cover a lower member including the color filter layer CFL. The overcoat layer OC may prevent moisture or air from infiltrating into the above-described lower member. Also, the overcoat layer OC may protect the above-described lower member from a foreign matter such as dust.

The overcoat layer OC may include an organic material such as an acrylic resin, an epoxy resin, a phenolic resin, a polyamide resin, a polyimide resin, an unsaturated polyester resin, a poly-phenylene ether resin, a poly-phenylene sulfide resin, or benzocyclobutene (BCB). However, the disclosure is not necessarily limited thereto, and the overcoat layer OC may include various kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The outer film layer OFL may be disposed on the overcoat layer OC. The outer film layer OFL may be disposed at an outer portion of the display device DD, to reduce external influence. The outer film layer OFL may be provided throughout the first to third sub-pixels SPXL1, SPXL2, and SPXL3. In some embodiments, the outer film layer OFL may include at least one of a polyethylenephthalate (PET) film, a low reflective film, a polarizing film, and a transmittance controllable film, but the disclosure is not necessarily limited thereto. In some embodiments, the pixel PXL may include an upper substrate instead of the outer film layer OFL.

Hereinafter, structures of a based layer BSL and a pad PAD in accordance with an embodiment of the disclosure will be described with reference to FIGS. 9 to 16. In FIGS. 9 to 16, descriptions of portions overlapping with those described above will be simplified or will not be repeated.

Figure 9:
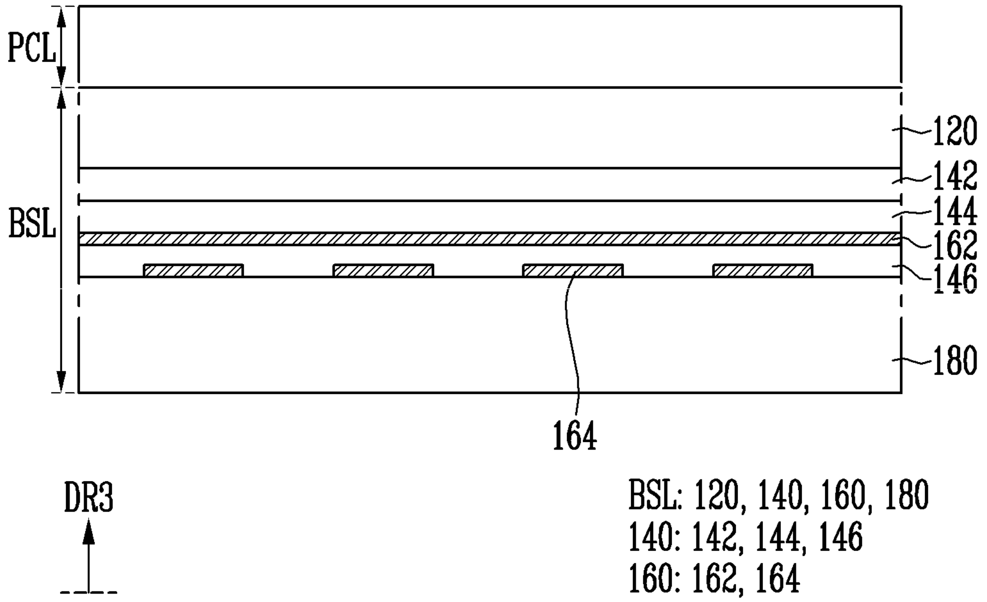
FIG. 9 is a schematic cross-sectional view illustrating a base layer in accordance with an embodiment of the disclosure.

First, a structure of a base layer BSL will be described with reference to FIG. 9. FIG. 9 is a schematic cross-sectional view illustrating a base layer in accordance with an embodiment of the disclosure. In FIG. 9, for convenience of description, a pixel circuit layer PCL is briefly illustrated, and illustration of components disposed in the pixel circuit layer PCL is omitted.

Referring to FIG. 9, the base layer BSL may include multiple layers. In some embodiments, the base layer may include a first base layer 120, a barrier layer 140, a blocking layer 160, and a second base layer 180. With respect to a rear surface of the pixel circuit layer PCL, the first base layer 120, the barrier layer 140, and the second base layer 180 may be sequentially disposed (or stacked), and the blocking layer 160 may be disposed between the first base layer 120 and the second base layer 180.

The first base layer 120 may form a base surface on which the pixel circuit layer PCL is disposed. For example, a surface of the base layer 120 may be disposed adjacent to (or in contact with) the pixel circuit layer PCL, and another surface of the first base layer 120 may be disposed adjacent to (or in contact with) the barrier layer 140. In some embodiments, the first base layer 120 may include one or more materials as described above. In some embodiments, the first base layer 120 may include polyimide. However, the disclosure is not necessarily limited thereto.

The barrier layer 140 may be disposed between the first base layer 120 and the second base layer 180. The barrier layer 140 may be interposed between the first base layer 120 and the second base layer 180, and cover at least a portion of each layer of pads PAD. The barrier layer 140 may include at least one selected from the group consisting of an amorphous silicon (a-Si), silicon oxide ($SiO_x$), silicon nitride ($SiN_x$), silicon oxynitride ($SiO_xN_y$), aluminum oxide ($AlO_x$), and titanium oxide ($TiO_x$).

In accordance with an embodiment, the barrier layer 140 may include multiple layers. For example, the barrier layer 140 may include a first barrier layer 142, a second barrier layer 144, and a third barrier layer 146.

A surface of the first barrier layer 142 may face the first base layer 120, and another surface of the first barrier layer 142 may face the second base layer 180, the blocking layer 160, the second barrier layer 144, and the third barrier layer 146. The first barrier layer 142 may be disposed between the first base layer 120 and the second barrier layer 144.

A surface of the second barrier layer 144 may face the first base layer 120 and the first barrier layer 142, and another surface of the second barrier layer 144 may face the second base layer 180, the blocking layer 160, and the third barrier layer 146. The second barrier layer 144 may be disposed between the first barrier layer 142 and a first blocking layer 162 of the blocking layer 160.

A surface of the third barrier layer 146 may face the first base layer 120, the first barrier layer 142, the second barrier layer 142, and a portion of the blocking layer 160, and another surface of the third barrier layer 146 may face the second base layer 180 and another portion of the blocking layer 160. A portion of the third barrier layer 146 may be disposed between the first blocking layer 162 and a second blocking layer 164 of the blocking layer 160, and another portion of the barrier layer 146 may be disposed between the first blocking layer 162 and the second base layer 180.

In accordance with an embodiment, the first barrier layer 142 may have a structure in which a layer including silicon nitride ($SiN_x$) and a layer including silicon oxynitride ($SiO_xN_y$) are alternately disposed. The second barrier layer 144 may have a structure in which a layer including an amorphous silicon (a-Si) and a layer including silicon oxide ($SiO_x$) are alternately disposed. The third barrier layer 146 may have a structure in which a layer including an amorphous silicon (a-Si) and a layer including silicon oxide ($SiO_x$) are alternately disposed. However, the disclosure is not necessarily limited to the above-described example.

The blocking layer 160 may be disposed between the first base layer 120 and the second base layer 180. The blocking layer 160 may be disposed between the second barrier layer 144 and the second base layer 180.

The blocking layer 160 may protect components covered by the blocking layer 160 from external influence. For example, the blocking layer 160 may prevent damaging the first base layer 120 during a process for exposing the pads PAD. In some embodiments, in case that a laser 2000 (see FIG. 13) process on the second base layer 180 is performed to expose the pads PAD, the blocking layer 160 may absorb (or block) the laser 2000, thereby preventing the laser 2000 from reaching (or substantially having influence on) the first base layer 120. For example, the blocking layer 160 may be a layer which blocking transmission of the laser 2000 by absorbing or reflecting the laser 2000 applied during the process.

Experimentally, in case that the laser 2000 is applied to the first base layer 120, a portion of the first base layer 120 may come off, and therefore, a separation phenomenon between the first base layer 120 and the first barrier layer 142 may occur. However, in accordance with an embodiment, the blocking layer 160 may be formed in a partial area of the base layer BSL. Accordingly, the laser 2000 for removing the second barrier layer 180 may be blocked from being transmitted even through the first base layer 120, and a risk in the process, such as the above-described separation phenomenon, may be prevented.

The blocking layer 160 may include multiple layers. For example, the blocking layer 160 may include the first blocking layer 162 and the second blocking layer 164, which are spaced apart from each other to be disposed in different layers.

The blocking layer 160 may include a material suitable for not allowing the laser 2000 (e.g., UV) transmitted therethrough. An example of the material included in the blocking layer 160 will be described below with reference to the following drawings.

The first blocking layer 162 may be disposed between the second barrier layer 144 and the third barrier layer 146. The second blocking layer 164 may be disposed between the second base layer 180 and the third barrier layer 146. The first blocking layer 162 may be disposed more adjacent to the first base layer 120 than the second blocking layer 164. The second blocking layer 164 may be disposed more adjacent to the second base layer 180 than the first blocking layer 162.

In some embodiments, the first blocking layer 162 may be patterned in an area wider than an area of the second blocking layer 164. The first blocking layer 162 may protect areas covered thereby from an external process influence. The second blocking layer 164 may protect areas covered thereby from external process influence, and simultaneously, overlap a partial area of the first blocking layer 162 in the thickness direction of the base layer BSL (e.g., the third direction DR3), thereby reducing influence on a partial area of the first blocking layer 162 due to an external process.

The second base layer 180 may form a base surface on which a chip-on-film COF is disposed. For example, a surface of the second base layer 180 may be disposed adjacent to (or in contact with) the chip-on-film COF, and another surface of the second base layer 180 may be disposed adjacent to (or in contact with) the barrier layer 140. In some embodiments, the second base layer 180 may include one or more materials as described above. In some embodiments, the second base layer 180 may include polyimide. However, the disclosure is not necessarily limited thereto.

Although not shown in the drawing, a lower film covering the base layer BSL may be disposed on the bottom of the second base layer 180. The lower film may protect the base layer BSL. In some embodiments, the lower film may include a polyethyleneterephthalate (PET) film.

Figure 10:
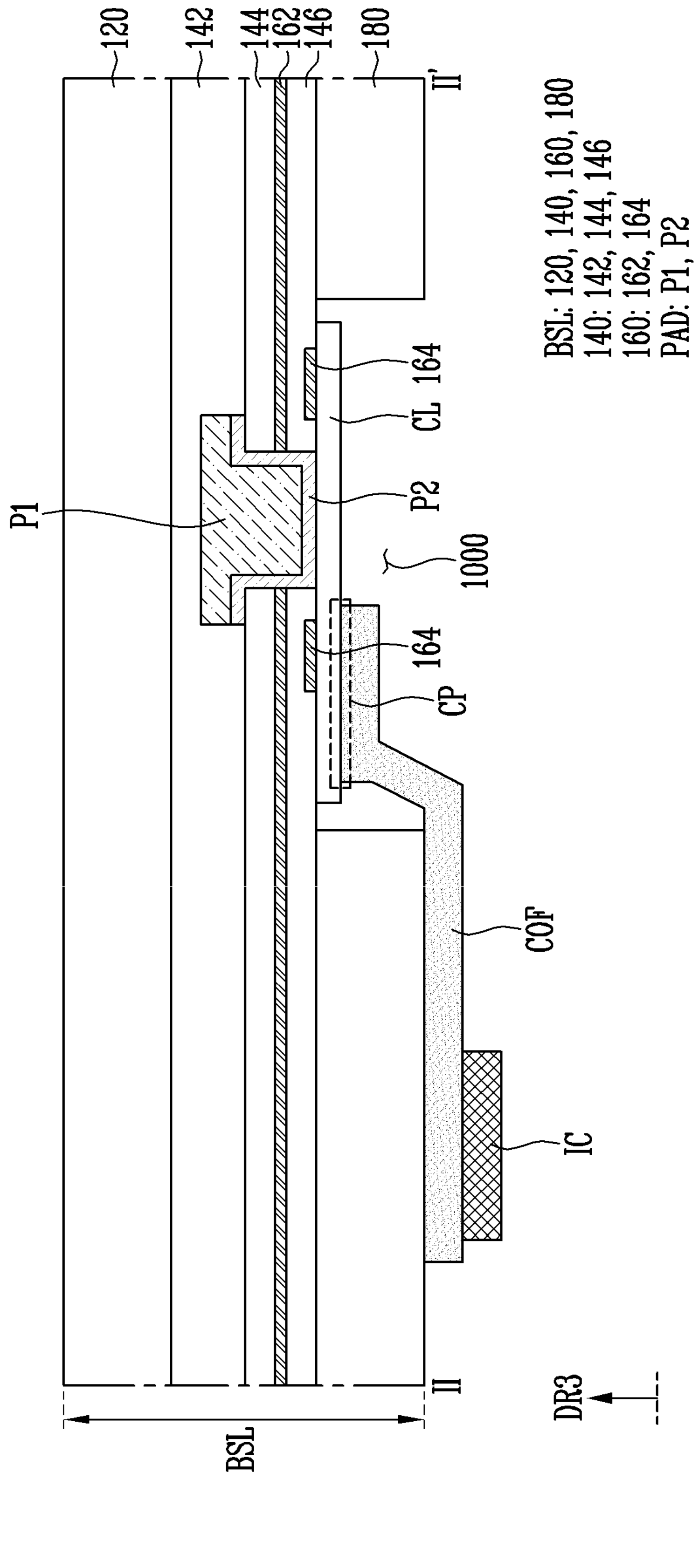
FIG. 10 is a schematic cross-sectional view taken along line II-II' shown in FIG. 4.

The base layer BSL, pads PAD disposed adjacent to the based layer BSL, and components electrically connected to the pads PAD will be described. FIG. 10 is a schematic cross-sectional view taken along line II-II' shown in FIG. 4. In FIG. 10, for convenience of description, the pixel circuit layer PCL is omitted.

Referring to FIG. 10, components electrically connected to a pad PAD disposed adjacent to (or inside) the base layer BSL are illustrated. For example, the pad PAD may be electrically connected to a connecting line CL. Although not shown in the drawing, the pad PAD may be electrically connected to the above-described lower connection electrode 200.

The pads PAD may be disposed between the first base layer 120 and the second base layer 180. At least a portion of the pads PAD may be covered by barrier layers 140. The pads PAD may be disposed on a rear surface of the first base layer 120.

The pads PAD may be disposed in a portion of an area in which the blocking layer 160 is not disposed. For example, the pads PAD may be surrounded by the first blocking layer 162, and be disposed between adjacent second blocking layers 164.

The pads PAD may include a first pad layer P1 and a second pad layer P2. However, the disclosure is not necessarily limited thereto. In some embodiments, the pads PAD may include an additional pad layer.

The first pad layer P1 may be disposed on a front surface of the second pad layer P2, and electrically connected to the second pad layer P2. In some embodiments, a surface of the first pad layer P1 may be covered by the first barrier layer 142, and another surface of the first pad layer P1 may be covered by the second pad layer P2. The first pad layer P1 may be electrically connected to a component (e.g., the lower connection electrode 200) of the pixel circuit layer PCL.

The second pad layer P2 may be disposed on another surface of the first pad layer P1, and electrically connected to the first pad layer P1. A surface of the second pad layer P2 may be covered by the first pad layer P1, and another surface of the second pad layer P2 may be covered by the second barrier layer 144 and the third barrier layer 146. The second pad layer P2 may be connected to the connecting line CL. A side surface of the second pad layer P2 may be covered by the second barrier layer 144. The second pad layer P2 may be electrically connected to the first pad layer P1 and the connecting line CL.

The first pad layer P1 and the second pad layer P2 may include different materials. For example, the second pad layer P2 may include titanium (Ti). The first pad layer P1 may include copper (Cu). However, the disclosure is not necessarily limited to the above-described example.

The second base layer 180 may have an opening area 1000, thereby exposing the third barrier layer 146, the second blocking layer 164, and the second pad layer P2. Accordingly, the connecting line CL may be patterned on the second pad layer P2, so that the second pad layer P2 can be electrically connected to the connecting line CL. In some embodiments, the opening area 1000 may correspond to an area in which the second base layer 180 is not disposed. In some embodiments, the second base layer 180 may not overlap the second pad layer P2 in a plan view.

The connecting line CL may be disposed on the third barrier layer 146 and the second pad layer P2 in the opening area 1000. The connecting line CL may be patterned extending in a direction, to electrically connect a chip-on-film COF and the second pad layer P2 to each other. In some embodiments, an anisotropic conductive film may be disposed between the connecting line CL and the second pad layer P2. The anisotropic conductive film may include multiple conductive balls, and electrically connect the connecting line CL and the second pad layer P2 to each other. The conductive balls may be conductive particles for electrically connecting at least two components to each other.

A portion of the chip-on-film COF may be disposed in the opening area 1000 to be electrically connected to the connecting line CL through a connection part CP. Another portion of the chip-on-film COF may be disposed on an area other than the opening area 1000, and may be disposed on a rear surface of the second base layer 180.

A driving chip IC may be disposed on a surface of the chip-on-film COF or be mounted in a partial area of the chip-on-film COF. As described above, the driving chip IC may output a data signal, and be electrically connected to the chip-on-film COF. Accordingly, the data signal output by the driving chip IC may be supplied to a data line DL through the chip-on-film COF, the connecting line CL, the pads PAD, and the lower connection electrode 200.

A structure of pads PAD in accordance with an embodiment of the disclosure will be described with reference to FIGS. 11 to 16. FIGS. 11 to 16 are schematic views illustrating pads in accordance with one or more embodiments of the disclosure. In FIGS. 11 to 16, descriptions of portions overlapping with the above-described portions will be simplified or will not be repeated.

Figure 11:
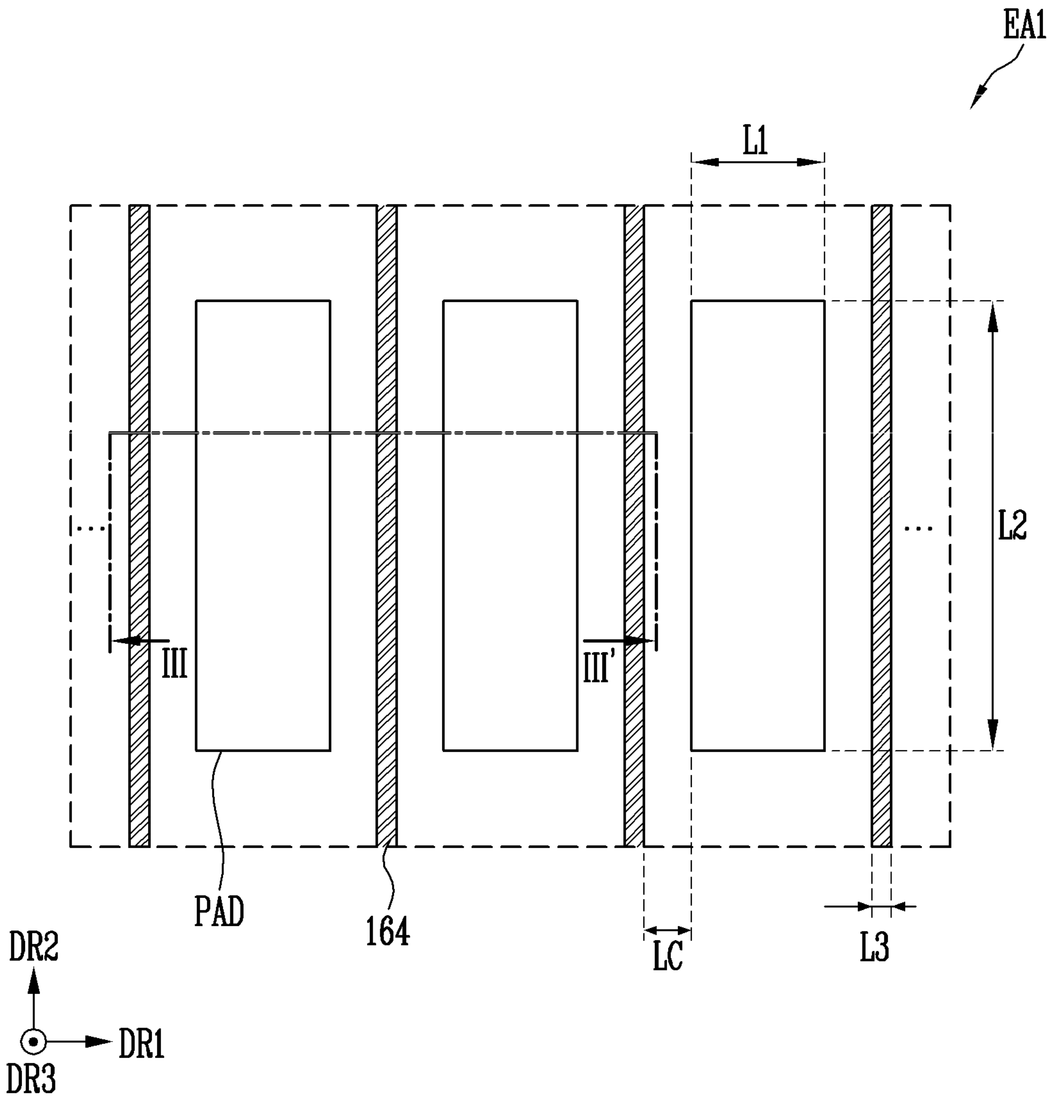
FIGS. 11 to 16 are schematic views illustrating pads in accordance with one or more embodiments of the disclosure.
Figure 12:
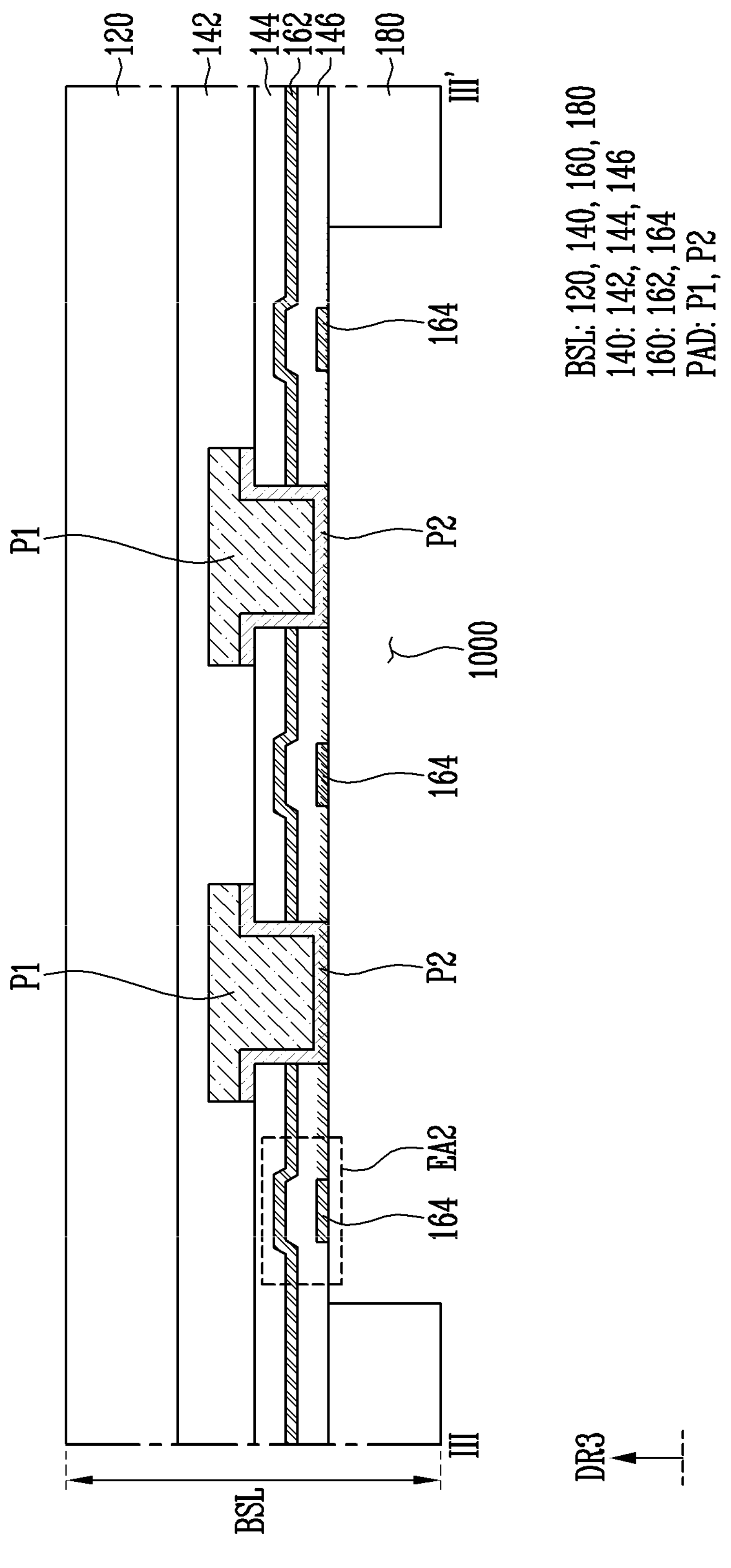
Figure 13:
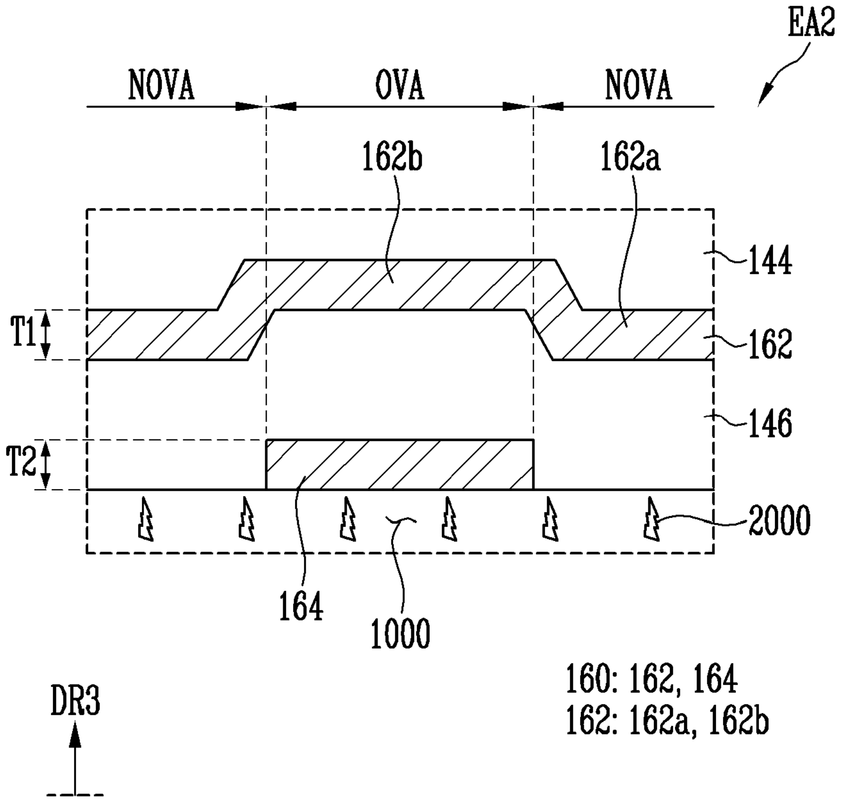

First, pads PAD in accordance with a first embodiment will be described with reference to FIGS. 11 to 13. FIGS. 11 to 13 are views illustrating pads PAD in accordance with a first embodiment. FIG. 11 is a schematic enlarged view of area EA1 shown in FIG. 4. FIG. 12 is a cross-sectional view taken along line III-III' shown in FIG. 11. FIG. 13 is a schematic enlarged view of area EA2 shown in FIG. 12.

Referring to FIGS. 11 to 13, the second blocking layer 164 may be disposed between adjacent pads PAD. For example, at least one second blocking layer 164 may be disposed between pads PAD adjacent to each other in the first direction DR1. In some embodiments, the second blocking layer 164 extending in the second direction DR2 different from the first direction DR1 may be disposed between the pads PAD adjacent to each other in the first direction DR1.

The second blocking layer 164 may be disposed to correspond to the opening area 1000 in which the second base layer 180 is not disposed. However, the disclosure is not necessarily limited to the above-described example. At least one second blocking layer 164 may be disposed adjacent to the opening area 1000, and a portion of the second blocking layer 164 may be disposed to overlap the second base layer 180.

The second blocking layer 164 may overlap a portion of the first blocking layer 162 in a plan view. For example, the second blocking layer 164 may not overlap the first blocking layer 162 in a non-overlapping area NOVA in a plan view. The second blocking layer 164 may overlap an overlapping blocking layer 162*b*, which is a portion of the first blocking layer 162 in an overlapping area OVA, in a plan view. In some embodiments, the overlapping blocking layer 162*b* may be disposed in the overlapping area OVA. Therefore, the overlapping blocking layer 162*b* may be disposed in an area in which a step difference is formed, as compared with a non-overlapping blocking layer 162*a*.

In accordance with an embodiment, each of the first blocking layer 162 and the second blocking layer 164 may include a silicon-based material. For example, the non-overlapping blocking layer 162$a$ not overlapping the second blocking layer 164 in the first blocking layer 162 may include a polycrystalline silicon (p-Si). The overlapping blocking layer 162$b$ overlapping the second blocking layer 164 in the first blocking layer 162 may include an amorphous silicon (a-Si). The second blocking layer 164 may include a polycrystalline silicon (p-Si). In some embodiments, the non-overlapping blocking layer 162$a$ may have electrical conductivity, and the overlapping blocking layer 162$b$ may have no electrical conductivity.

The second blocking layer 164 may prevent occurrence of a short-circuit defect between adjacent pads PAD. In some embodiments, the overlapping blocking layer 162$b$ overlapping the second blocking layer 164 may not electrically connect adjacent non-overlapping blocking layers 162$a$. The overlapping blocking layer 162$b$ and the non-overlapping blocking layer 162$a$ may include different materials. Since the conductivity of the material (e.g., amorphous silicon) forming the overlapping blocking layer 162$b$ is very low, the material may substantially have a non-conductive property. Accordingly, non-overlapping blocking layers 162$a$ disposed between adjacent pads PAD while being spaced apart from each other are physically connected to each other by the overlapping blocking layer 162$b$ but can be electrically separated from each other. As a result, a short-circuit defect risk with respect to the adjacent pads PAD can be substantially prevented.

For example, in case that the laser 2000 for forming the opening area 1000 is applied after the first blocking layer 162 and the second blocking layer 164, each of which includes an amorphous silicon (a-Si), are patterned, the second blocking layer 164 may cover the overlapping area OVA, and may not cover the non-overlapping area NOVA. Accordingly, the laser 2000 may be not substantially applied to the first blocking layer 162 in the overlapping area OVA, and may be applied to the first blocking layer 162 in the non-overlapping area NOVA. The laser 2000 may be applied to the non-overlapping blocking layer 162$a$ and the second blocking layer 164, and at least a portion of the amorphous silicon (a-Si) forming the non-overlapping blocking layer 162$a$ and the second blocking layer 164 may be crystallized to be changed to a polycrystalline silicon (p-Si). The laser 2000 may not be substantially applied to the overlapping blocking layer 162$b$, and the amorphous silicon (a-Si) forming the overlapping blocking layer 162$b$ may not be changed. Experimentally, since the conductivity of the amorphous silicon (a-Si) is very low, the overlapping blocking layer 162$b$ which does not substantially including the polycrystalline silicon (p-Si) may electrically separate adjacent non-overlapping blocking layers 162$a$ having conductivity from each other. As a result, a risk that adjacent pads PAD will be short-circuited by the first blocking layer 162 may be prevented.

The first blocking layer 162 may have a first thickness T1 in the thickness direction of the base layer BSL (e.g., a third direction DR3). The second blocking layer 164 may have a second thickness T2 in the thickness direction of the base layer BSL (e.g., a third direction DR3). In some embodiments, each of the first thickness T1 and the second thickness T2 may be a thickness suitable for not allowing the laser 2000 transmitted therethrough applied in a process for forming the second base layer 180.

For example, in case that the laser 2000 is provided as ultraviolet (UV), each of the first thickness T1 and the second thickness T2 may be equal to or greater than about 500 Å so as to efficiently block the laser 2000. For example, in case that a beam of the laser 2000 has a wavelength of about 343 nm, each of the first blocking layer 162 and the second blocking layer 164 may include a silicon-based material. Each of the first thickness T1 and the second thickness T2 may be in a range of about 500 Å to about 800 Å. In case that the silicon-based material (e.g., amorphous silicon (a-Si)) has a thickness greater than or equal to about 500 Å, each of the first blocking layer 162 and the second blocking layer 164 may not substantially transmit the laser 2000 provided as the UV therethrough. In case that each of the first thickness T1 and the second thickness T2 satisfies the above-described numerical range, each of the first blocking layer 162 and the second blocking layer 164 may not allow the laser 2000 substantially transmitted therethrough.

In accordance with an embodiment, the second thickness T2 may be greater than the first thickness T1. As described above, the second blocking layer 164 may block the laser 2000 from being applied to the first base layer 120, and simultaneously, block the laser 2000 from being applied to the overlapping blocking layer 162$b$ so as to prevent a short-circuit defect between pads PAD. For example, the second blocking layer 164 may be provided to be thicker, and accordingly, an insulation effect between the non-overlapping blocking layers 162$a$ may be maximized.

The pads PAD may have a size of a first length L1 in a direction (e.g., the first direction DR1) in which the pads PAD are arranged adjacent to each other. The pads PAD may have a size of a second length L2 in a direction (e.g., the second direction DR2) different from the direction in which the pads PAD are arranged adjacent to each other. The second blocking layer 164 may have a size (e.g., a width) of a third length L3 in the direction (e.g., the first direction DR1) in which the pads PAD are arranged adjacent to each other. In some embodiments, the first length L1 may be in a range of about 12 μm to about 17 μm. The second length L2 may be in a range of about 1000 μm to about 1200 μm. The third length L3 may be in a range of about 13 μm to about 19 μm. However, the disclosure is not necessarily limited thereto.

In accordance with an embodiment, a separation distance LC between the second blocking layer 164 and the pad PAD in the first direction DR1 may be determined according to the third length L3 of the second blocking layer 164. In some embodiments, the separation distance LC may be greater than a diameter of a conductive ball included in an anisotropic conductive film for connecting the connecting line CL and the pads PAD to each other. The conductive ball may not electrically connect the second blocking layer 164 and the pads PAD at a same time, and thus a short-circuit defect between the second blocking layer 164 and the pads PAD due to the conductive ball may be prevented.

Figure 14:
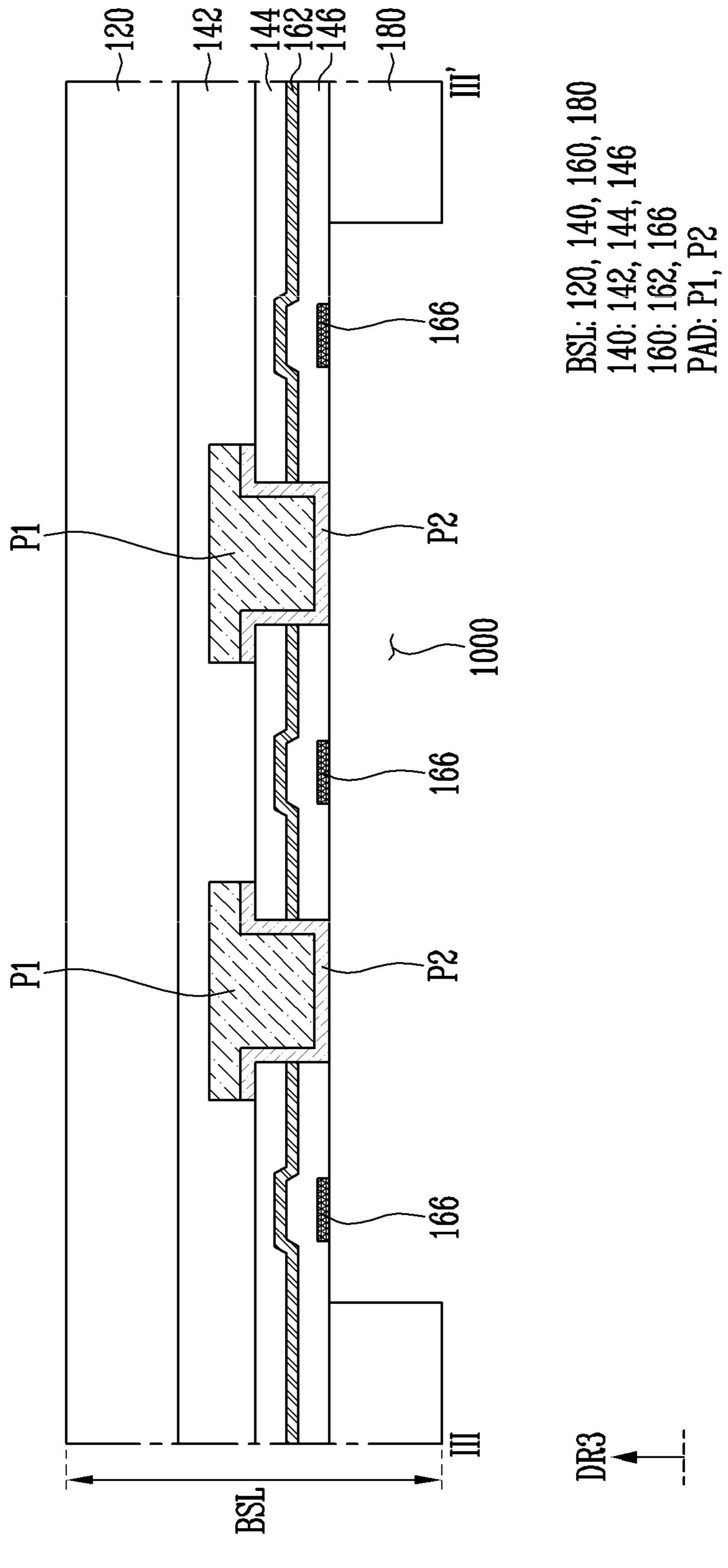

Pads PAD in accordance with a second embodiment will be described with reference to FIG. 14. Comparing the second embodiment with the above-described embodiment, the pads PAD in accordance with the second embodiment will be described based on portions different from the portions of the above-described embodiment. FIG. 14 illustrates a partially modified structure of the pads PAD with respect to the structure according to FIG. 12 in accordance with the second embodiment.

Referring to FIG. 14, the blocking layer 160 may include a metal blocking layer 166. The metal blocking layer 166 may be patterned to correspond to the position at which the above-described second blocking layer 164 is disposed. The metal blocking layer 166 may include a metal capable of blocking the laser 2000. For example, the metal blocking layer 166 may include copper (Cu), silver (Ag), or the like. However, the disclosure is not limited to the above-described example.

In accordance with an embodiment, the metal blocking layer 166 may prevent the laser 2000 from being applied to a portion of the first blocking layer 162, so that the first blocking layer 162 can be prevented from being changed to a conductive material in the portion. As a result, a short-circuit defect between pads PAD may be prevented.

Figure 15:
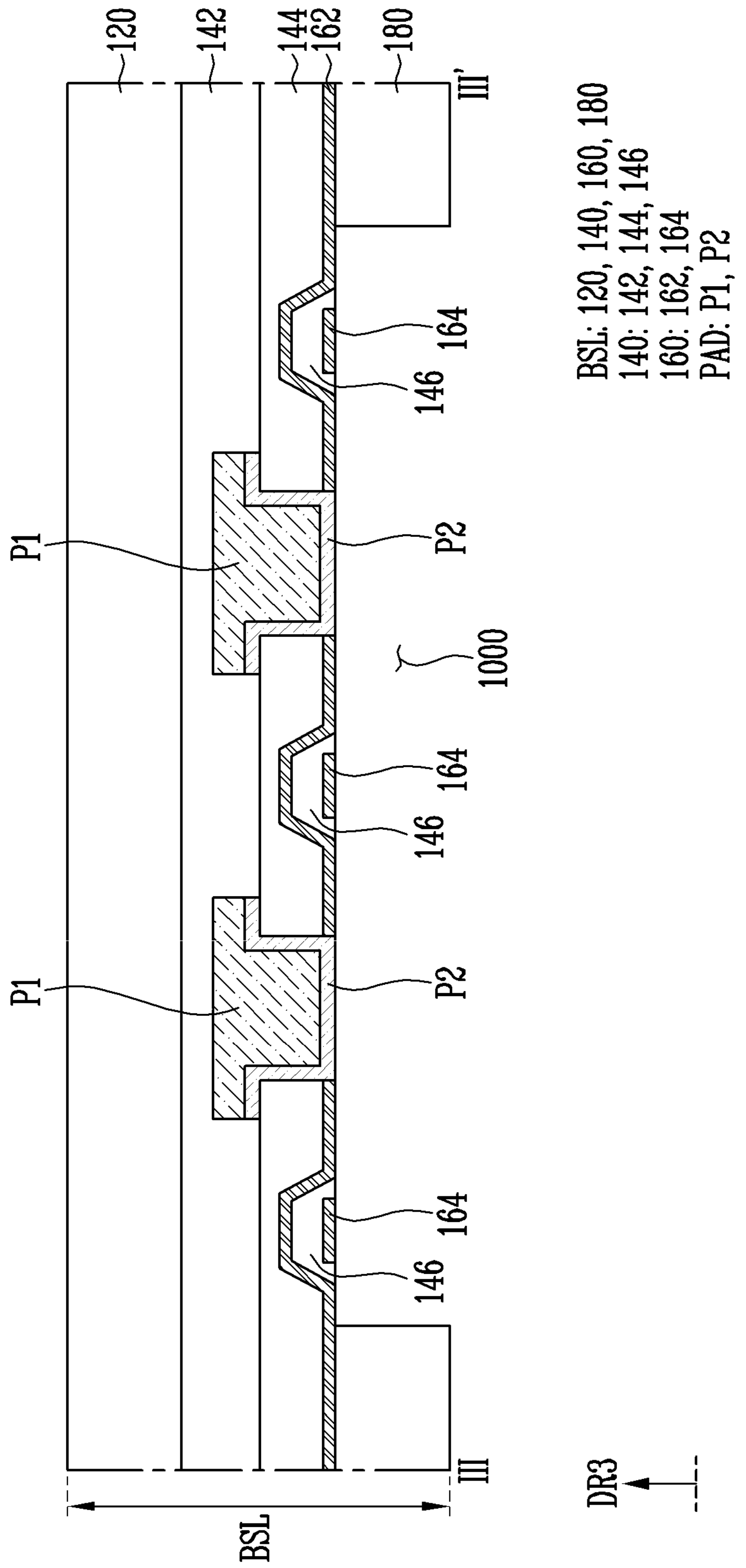

Pads PAD in accordance with a third embodiment will be described with reference to FIG. 15. Comparing the third embodiment with the above-described embodiment, the pads PAD in accordance with the third embodiment will be described based on portions different from the portions of the above-described embodiment. FIG. 15 illustrates a partially modified structure of the pads PAD with respect to the structure according to FIG. 12 in accordance with the third embodiment.

Referring to FIG. 15, the third barrier layer 146 may be selectively disposed adjacent to an area in which the second blocking layer 164 is disposed. For example, the third barrier layer 146 may cover the second blocking layer 164, and may not be disposed in an area not corresponding to the area in which the second blocking layer 164 is disposed. In some embodiments, the third barrier layer 146 may be selectively disposed in an area corresponding to a portion of the opening area 1000, and may not overlap the second base layer 180 in the thickness direction of the base layer BSL (e.g., a third direction DR3). In some embodiments, the third barrier layer 146 may not overlap the first blocking layer 162 in an area in which the second blocking layer 164 is not disposed in the thickness direction. Thus, a risk (e.g., a separation phenomenon of the third barrier layer 146) which may occur as an amorphous silicon (a-Si) forming the first blocking layer 162 is changed to a polycrystalline silicon (p-Si) in the non-overlapping area NOVA may be prevented.

Figure 16:
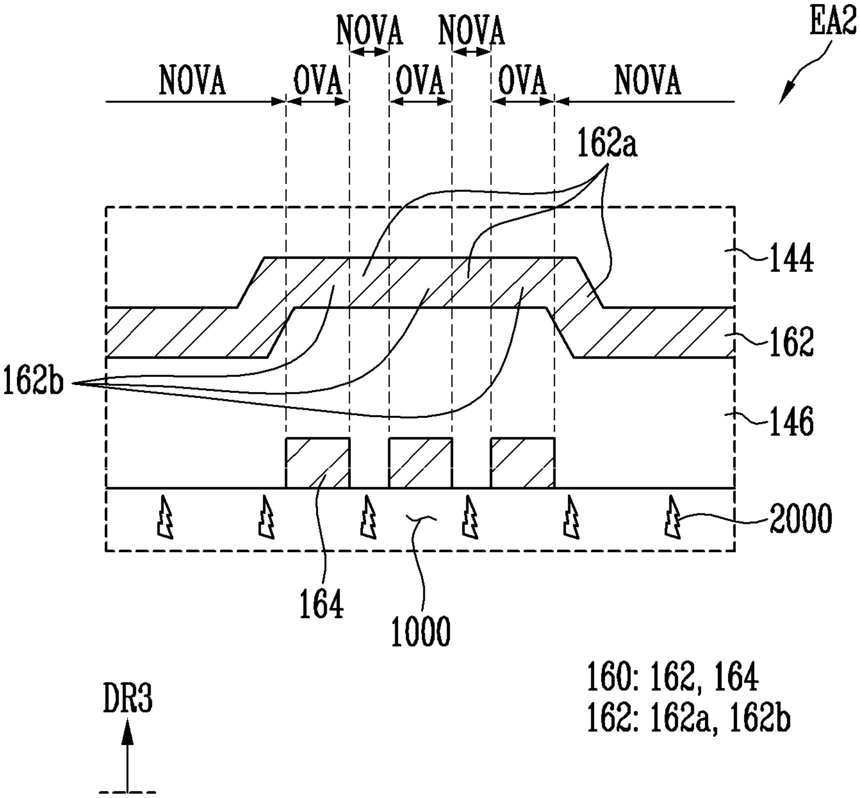

Pads PAD in accordance with a fourth embodiment will be described with reference to FIG. 16. Comparing the fourth embodiment with the above-described embodiment, the pads PAD in accordance with the fourth embodiment will be described based on portions different from the portions of the above-described embodiment. FIG. 16 illustrates a partially modified structure of the pads PAD with respect to the structure according to FIG. 13 in accordance with the fourth embodiment.

Referring to FIG. 16, the second blocking layer 164 may have at least two pattern structures spaced apart from each other. For example, the second blocking layer 164 may be disposed to be divided into multiple second blocking layers between a non-overlapping blocking layer **162*a* adjacent to a pad PAD and a non-overlapping blocking layer 162*a*** adjacent to another pad PAD. Accordingly, multiple overlapping areas OVA spaced apart from each other may be formed between a non-overlapping area NOVA adjacent to the pad PAD and a non-overlapping area NOVA adjacent to the another pad PAD, and a non-overlapping area NOVA may be formed between the overlapping areas OVA spaced apart from each other.

In accordance with an embodiment, the overlapping blocking layer **162*b* disposed in the overlapping area OVA may be divided into multiple overlapping blocking layers, to prevent the non-overlapping blocking layers 162*a* from being electrically connected to each other. In accordance with an embodiment, the non-overlapping blocking layers 162*a* and the overlapping blocking layer 162*b* may be connected side by side to each other, so that a short-circuit defect between pads PAD can be prevented even in case that only at least one of the non-overlapping blocking layers 162*b* blocks electrical flow in the first blocking layer 162**. Thus, the technical effect of short-circuit defect prevention may be more reliably proved.

Figure 17:
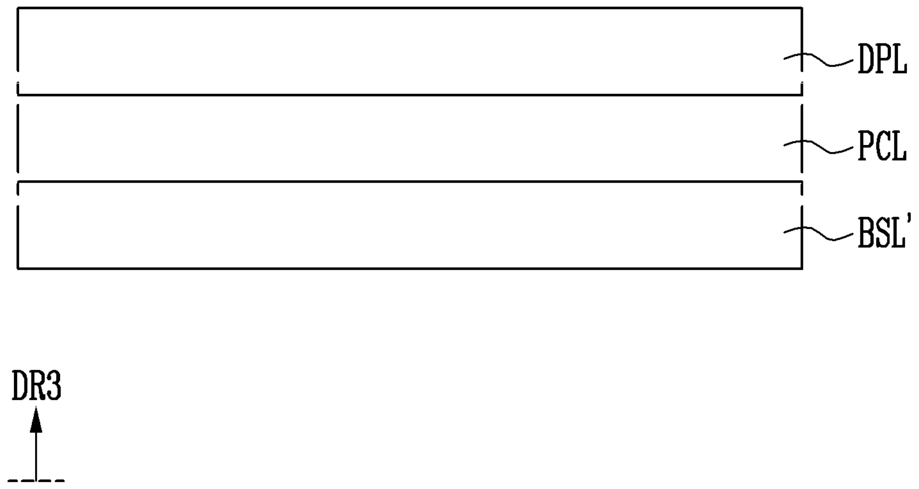
FIGS. 17 to 19 are schematic cross-sectional views illustrating a manufacturing method for the display device in accordance with one or more embodiments of the disclosure.
Figure 18:
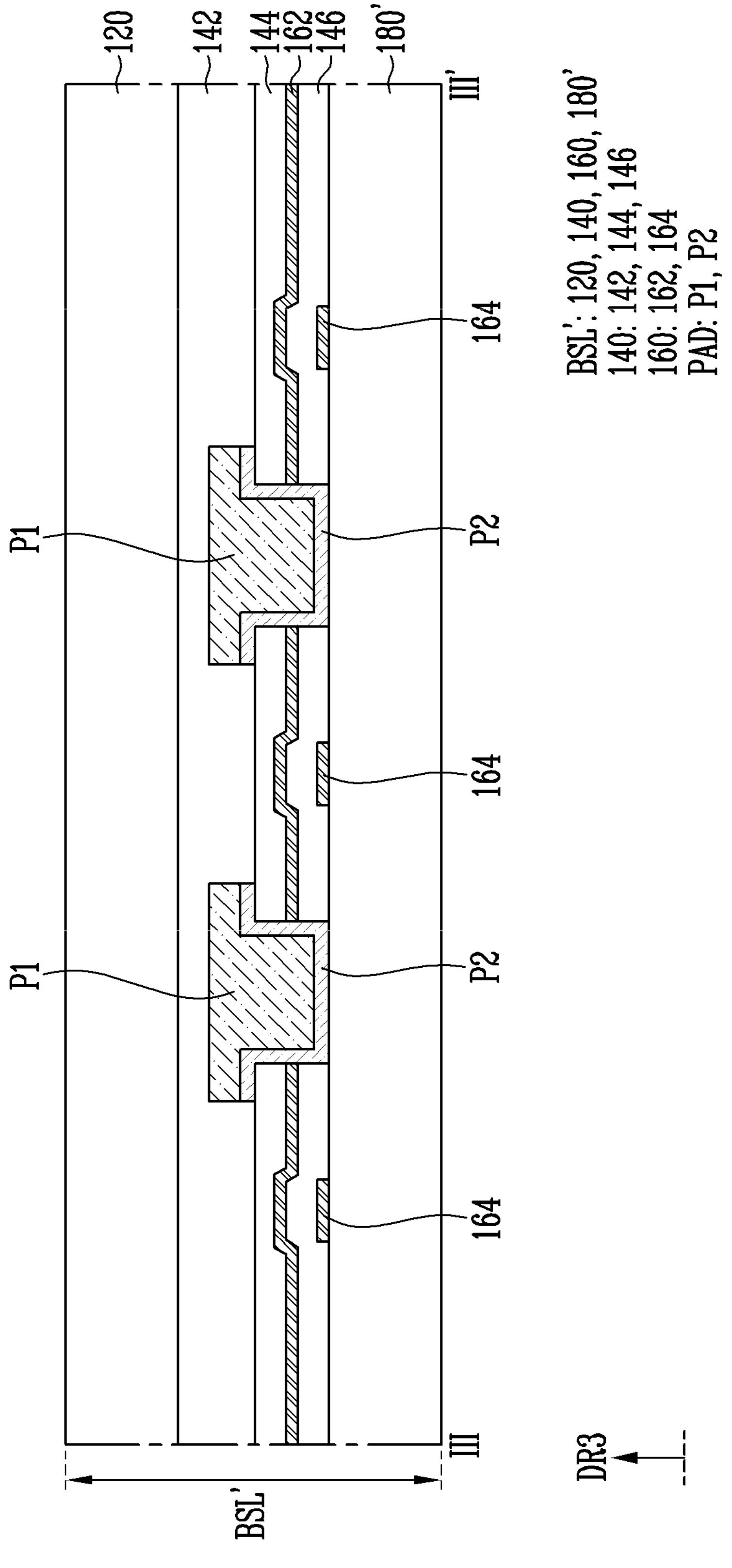
Figure 19:
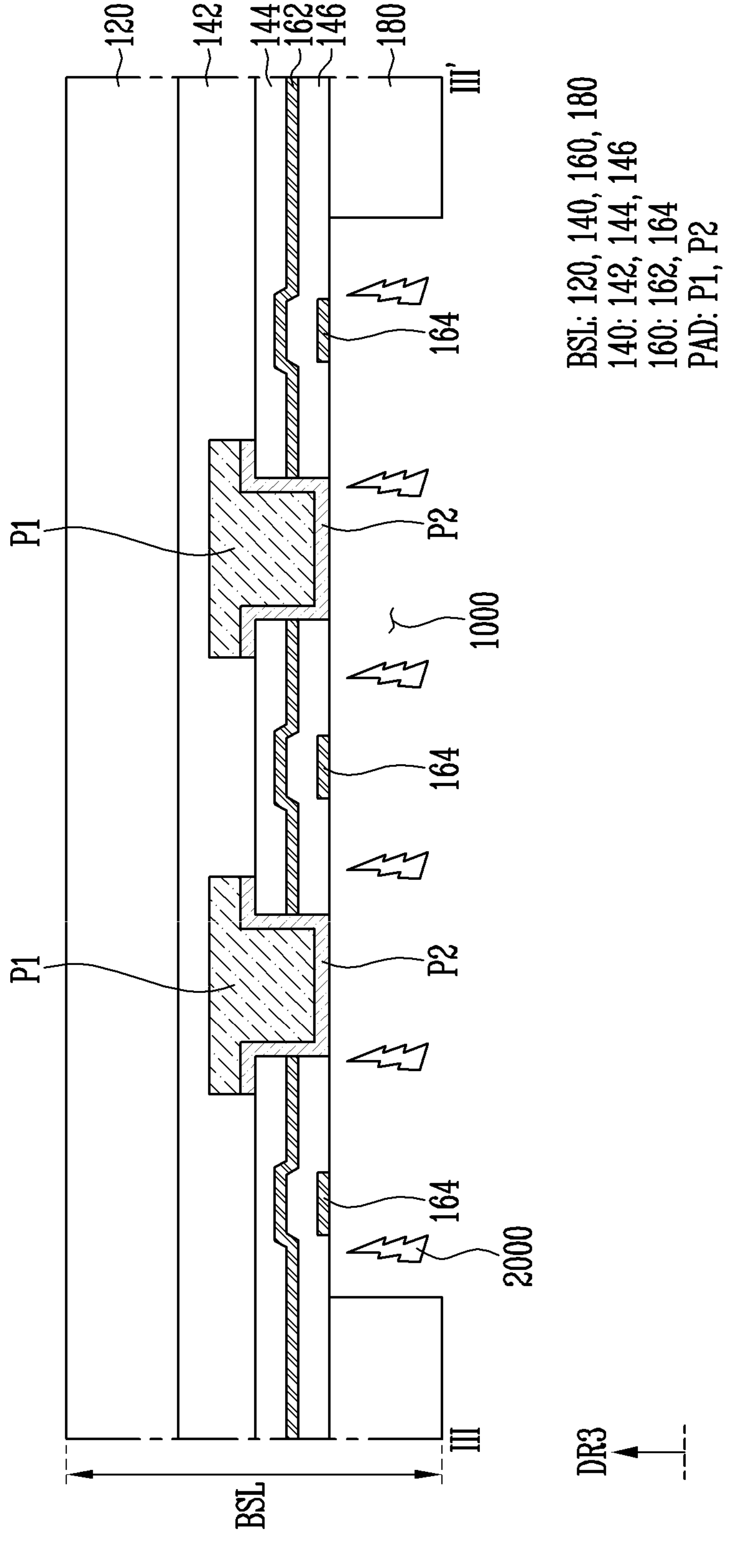

Hereinafter, a manufacturing method for the display device DD in accordance with an embodiment of the disclosure will be described with reference to FIGS. 17 to 19. FIGS. 17 to 19 are schematic cross-sectional views illustrating a manufacturing method for the display device in accordance with one or more embodiments of the disclosure. In FIGS. 17 to 19, descriptions of portions overlapping with the above-described portions will be simplified or will not be repeated.

FIGS. 17 and 18 are schematic cross-sectional views illustrating a manufacturing method for the display device DD before a laser 2000 process is performed. FIG. 19 is a schematic cross-sectional view illustrating a manufacturing method of the display device DD during the laser 2000 process is performed (or after the laser 2000 process is performed).

FIG. 17 is a schematic cross-sectional view illustrating a manufacturing method for the display device DD in accordance with an embodiment of the disclosure, and illustrates an pre-etched base layer BSL', a pixel circuit layer PCL, and a display element layer DPL, which are sequentially stacked. FIG. 18 schematically shows a cross-sectional structure including the pre-etched base layer BSL', and illustrates an area corresponding to the cross-sectional structure taken along the line III-III' shown in FIG. 12. FIG. 19 schematically shows a cross-sectional structure including a base layer BSL, and illustrates an area corresponding to the cross-sectional structure taken along the line III-III' shown in FIG. 12.

Referring to FIGS. 17 and 18, a pre-etched base layer BSL' may be formed (or provided), a pixel circuit layer PCL may be disposed (or provided) on the pre-etched base layer BSL', and a display element layer DPL may be disposed (or provided) on the pixel circuit layer PCL.

Individual components of the pre-etched base layer BSL', the pixel circuit layer PCL, and the display element layer DPL may be manufactured (or formed) by patterning a conductive layer (or metal layer), an inorganic material, an organic material, or the like through an ordinary process using a mask.

The pre-etched base layer BSL' may be manufactured. The pre-etched base layer BSL' may be manufactured by sequentially disposing (or patterning) a pre-etched second base layer 180', a second blocking layer 164, a third barrier layer 146, a first blocking layer 162, a second barrier layer 144, a second pad layer P2, a first pad layer P1, a first barrier layer 142, and a first base layer 120. In some embodiments, pads PAD may be patterned to be disposed between the first base layer 120 and the pre-etched second base layer 180'.

In order to form the display element layer DPL, alignment electrodes ELT may be patterned, and light emitting elements LD may be aligned between the alignment electrodes ELT. For example, the light emitting elements LD may be disposed on the pre-etched base layer BSL'.

In accordance with an embodiment, a layer including an amorphous silicon (a-Si) may be patterned to form the first blocking layer 162, and a layer including an amorphous silicon (a-Si) may be patterned to form the second blocking layer 164. For example, the first blocking layer 162 and the second blocking layer 164 may include a same material. In some embodiments, in order to provide the structure in accordance with the second embodiment (see FIG. 14), the second blocking layer 164 may include a metal.

In accordance with an embodiment, in order to provide the structure in accordance with the third embodiment (see FIG. 15), the third barrier layer 146 may be selectively patterned to correspond to an area in which the second blocking layer 164 is disposed. After a base barrier layer for forming the third barrier layer 146 is deposited, an etching process on the base barrier layer may be further performed.

In accordance with an embodiment, in order to provide the structure in accordance with the fourth embodiment (see FIG. 16), the second blocking layer 164 may be divided into multiple second blocking layers to be patterned between adjacent pads PAD.

Referring to FIG. 19, a second base layer 180 may be manufactured by removing at least a portion of the pre-etched second base layer 180'. For example, a laser 2000 process may be performed on the pre-etched second base layer 180'. In some embodiments, when the laser 2000 process is performed, the orientation of a stacked structure including the manufactured pre-etched base layer BSL' may be changed such that the pre-etched base layer BSL' faces downwardly with respect to the direction of gravity. However, the disclosure is not limited thereto. For convenience of description, cross-sectional structures are illustrated without separately changing the direction of the stacked structure including the manufactured pre-etched base layer BSU.

In accordance with an embodiment, the laser 2000 may have a wavelength suitable for removing the pre-etched second base layer 180'. For example, in case that the pre-etched second base layer 180' includes polyimide, the laser 200 may be a beam in a UV wavelength band (e.g., a wavelength band in about 343 nm).

In accordance with an embodiment, a process for forming an opening area 1000 may be performed within a single process. For example, after the laser 2000 process is performed, the pads PAD may be exposed. In some embodiments, the opening area 1000 may be formed through only a single laser 2000 process, so that a process time can be reduced. For example, a separate process (e.g., a plasma process) may be performed after the laser 2000 process is performed due to a risk which may occur when the laser 2000 is applied to the pre-etched base layer BSL'. However, in accordance with the embodiment, any risk which may occur when the laser 2000 process is performed may be substantially prevented, so that the opening area 1000 can be efficiently formed through only a single laser 2000 process.

At least a portion of the pre-etched second base layer 180' may be etched, and accordingly, the second base layer 180 of which at least portions are spaced apart from each other may be formed. In some embodiments, the opening area 1000 may be formed, and accordingly, at least a portion of the second pad layer P2 and at least a portion of the third barrier layer 146 may be exposed. Therefore, as a subsequent process is performed, the pads PAD may be electrically connected to another component (e.g., a connecting line CL).

In accordance with an embodiment, the laser 2000 may not be substantially transmitted through the first blocking layer 162 and the second blocking layer 164, not to be applied to the first base layer 120. Accordingly, a separation phenomenon between the first base layer 120 and the first barrier layer 142 may be prevented.

In accordance with an embodiment, the second blocking layer 164 may not allow the laser 2000 substantially transmitted therethrough, and therefore, a partial area of the first blocking layer 162, which overlaps the second blocking layer 164, may block an electrical path. As described above, the second blocking layer 164 may be disposed under the first blocking layer 162, so that the amorphous silicon (a-Si) can be prevented from being changed to a polycrystalline silicon (p-Si) having conductivity in a partial area of the first blocking layer 162. Thus, an electrical path may be not entirely formed in the first blocking layer 162. As a result, in accordance with the embodiment, a blocking layer 160 may be formed, so that a risk such as a separation phenomenon in the base layer BSL due to the laser 2000 can be prevented, and simultaneously, a short-circuit defect between the pads PAD can be prevented even in case that a portion of the blocking layer 160 is changed by energy of the laser 2000.

In accordance with the disclosure, there is provided a display device, a tiled display device, and a manufacturing method for a display device, which can improve process efficiency of the display device.

In accordance with the disclosure, there is provided a display device, a tiled display device, and a manufacturing method for a display device, which can prevent a short-circuit defect in the display device.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a base layer including a first base layer and a second base layer disposed on a rear surface of the first base layer;

light emitting elements disposed on a surface of the first base layer; and pads including a first pad and a second pad, which are disposed on the rear surface of the first base layer and are spaced apart from each other, wherein the base layer further includes blocking layers which are disposed between the first base layer and the second base layer, at least portions of the blocking layers do not overlap the pads in a plan view, the blocking layers include a first blocking layer and a second blocking layer, which are disposed in different layers, and the first blocking layer and the second blocking layer are between a top surface of the pad closest to the first base layer, and the second base layer in a cross section view.

2. The display device of claim 1, wherein the second blocking layer is disposed between adjacent ones of the pads.

3. The display device of claim 2, wherein, in a plan view, the first blocking layer and the second blocking layer overlap each other in an overlapping area, and the first blocking layer and the second blocking layer do not overlap each other in a non-overlapping area.

4. The display device of claim 3, wherein the first blocking layer includes:

a non-overlapping blocking layer disposed in the non-overlapping area; and an overlapping blocking layer disposed in the overlapping area, and the overlapping blocking layer and the non-overlapping blocking layer include different materials.

5. The display device of claim 4, wherein the second blocking layer includes a polycrystalline silicon, and the overlapping blocking layer includes an amorphous silicon.

6. The display device of claim 3, wherein a thickness of each of the first blocking layer and the second blocking layer in a thickness direction of the base layer is in a range of about 500Å to about 800 Å.

7. The display device of claim 5, wherein a thickness of the second blocking layer in a thickness direction of the base layer is greater than a thickness of the first blocking layer in the thickness direction.

8. The display device of claim 1, wherein the base layer further includes:

a first barrier layer disposed between the first base layer and the pads;

a second barrier layer disposed between the first barrier layer and the first blocking layer; and a third barrier layer disposed between the second barrier layer and the second blocking layer.

9. The display device of claim 8, wherein the first base layer includes polyimide, the second base layer includes polyimide, the first barrier layer includes a layer including silicon nitride and a layer including silicon oxynitride alternately disposed, the second barrier layer includes a layer including an amorphous silicon and a layer including silicon oxide alternately disposed, and the third barrier layer includes a layer including an amorphous silicon and a layer including silicon oxide alternately disposed.

10. The display device of claim 1, wherein the second blocking layer includes a metal.

11. The display device of claim 8, wherein the third barrier layer is selectively patterned in an area in which the second blocking layer is disposed.

12. A display device comprising:

a base layer including a first base layer and a second base layer disposed on a rear surface of the first base layer;

light emitting elements disposed on a surface of the first base layer; and pads including a first pad and a second pad, which are disposed on the rear surface of the first base layer and are spaced apart from each other, wherein the base layer further includes blocking layers which are disposed between the first base layer and the second base layer, at least portions of the blocking layers do not overlap the pads in a plan view the blocking layers include a first blocking layer and a second blocking layer, which are disposed in different layers, wherein the second blocking layer is disposed between adjacent ones of the pads, and wherein the second blocking layer includes a plurality of patterns spaced apart from each other between the adjacent ones of the pads.

13. The display device of claim 1, wherein in a plan view, the second base layer does not overlap the pads, and the second base layer includes an opening area.

14. The display device of claim 1, further comprising:

a display area in which a pixel including the light emitting elements is disposed;

a non-display area surrounding at least a portion of the display area;

a driving chip that provides an electrical signal to the pixel; and a chip-on-film on which the driving chip is provided, wherein the pads are electrically connected to the chip-on-film, and the chip-on-film and the driving chip overlap the display area in a plan view.

15. The display device of claim 14, further comprising:

an anisotropic conductive film including conductive balls, the anisotropic conductive film electrically connecting the chip-on-film and the pads to each other, wherein a distance between the second blocking layer and the pads is greater than a diameter of the conductive balls.

16. An electronic device the display device of claim 1.

* * * * *